United States Patent
Yasue

(10) Patent No.: US 7,336,046 B2
(45) Date of Patent: Feb. 26, 2008

(54) SHORT-CIRCUIT DETECTION IN ELECTRIC PATH CONNECTING DRIVE DEVICE AND LOAD

(75) Inventor: Satoka Yasue, Kariya (JP)

(73) Assignee: Denso Corporation, Kariya, Aichi-pref. (JP)

( * ) Notice: Subject to any disclaimer, the term of this patent is extended or adjusted under 35 U.S.C. 154(b) by 3 days.

(21) Appl. No.: 11/488,912

(22) Filed: Jul. 19, 2006

(65) Prior Publication Data

US 2007/0018656 A1    Jan. 25, 2007

(30) Foreign Application Priority Data

| Jul. 19, 2005 | (JP) | ............................. 2005-208546 |
| Nov. 22, 2005 | (JP) | ............................. 2005-337153 |
| Jun. 2, 2006 | (JP) | ............................. 2006-154124 |

(51) Int. Cl.
  *H02P 1/18* (2006.01)
  *H03K 5/19* (2006.01)

(52) U.S. Cl. ..................... 318/254; 318/343; 361/18; 361/36; 324/509

(58) Field of Classification Search ............... 318/254, 318/434, 138, 245; 361/36, 93.1, 18, 160; 324/509
See application file for complete search history.

(56) References Cited

U.S. PATENT DOCUMENTS

| 5,541,806 | A | * | 7/1996 | Hoffman | ..................... 361/160 |
| 5,568,343 | A | * | 10/1996 | Kosugi | ........................ 361/36 |
| 5,675,297 | A | * | 10/1997 | Gose et al. | .................. 332/109 |
| 5,889,376 | A | * | 3/1999 | Takatsuka et al. | .......... 318/434 |
| 6,107,926 | A | * | 8/2000 | Kifuku et al. | .............. 340/650 |
| 7,045,982 | B2 | * | 5/2006 | Amakusa | ..................... 318/254 |
| 7,064,553 | B2 | * | 6/2006 | Tani et al. | .................. 324/509 |
| 7,154,240 | B2 | * | 12/2006 | Watanabe | ..................... 318/434 |
| 2005/0017662 | A1 | * | 1/2005 | Amakusa | ..................... 318/254 |
| 2005/0083066 | A1 | * | 4/2005 | Tani et al. | .................. 324/509 |
| 2005/0184688 | A1 | * | 8/2005 | Hirochi et al. | .............. 318/254 |

(Continued)

FOREIGN PATENT DOCUMENTS

JP    09-196991    7/1997

(Continued)

OTHER PUBLICATIONS

U.S. Appl. No. 11,411,948, filed Apr. 27, 2006.

Primary Examiner—Paul Ip
(74) Attorney, Agent, or Firm—Nixon & Vanderhye P.C.

(57) ABSTRACT

A control device controls a drive signal supplied from a drive device to a load apparatus along an electric path connecting the drive device and the load apparatus. The drive device receives a PWM (pulse width modulation) signal to PWM-control the drive signal, detects information about a short circuit in the path, and notifies the detected information about the short circuit. The control device comprises means for producing the PWM signal; means for inquiring of the drive device about the information about the short circuit at predetermined inquiry intervals; first determining means for determining whether or not the short circuit has been detected based on the information notified in response to the inquiry; and second determining means for determining how the short circuit occurs, based on history information in the information about the short circuit notified when the first determining means determines that the short circuit has been detected.

18 Claims, 18 Drawing Sheets

U.S. PATENT DOCUMENTS

| | | |
|---|---|---|
| 2005/0194998 A1* | 9/2005 | Watanabe .................... 327/109 |
| 2005/0280570 A1* | 12/2005 | Kanekawa et al. ......... 341/155 |
| 2006/0012249 A1* | 1/2006 | Kobayashi et al. ........... 307/11 |
| 2006/0039131 A1* | 2/2006 | Nakazawa et al. ............ 362/43 |
| 2006/0087266 A1* | 4/2006 | Krenzke et al. ............ 318/254 |
| 2006/0164772 A1* | 7/2006 | Guo .......................... 361/93.1 |
| 2006/0197508 A1* | 9/2006 | Matsumoto et al. ........ 323/201 |
| 2006/0221525 A1* | 10/2006 | Konishi ..................... 361/93.1 |

FOREIGN PATENT DOCUMENTS

JP    2002-324710    11/2002

\* cited by examiner

SHORT-CIRCUIT DETECTION IN ELECTRIC PATH CONNECTING DRIVE DEVICE AND LOAD

CROSS REFERENCES TO RELATED APPLICATIONS

The present application relates to and incorporates by reference Japanese Patent application Nos. 2005-208546 filed on Jul. 19, 2005, 2005-337153 filed on Nov. 22, 2005, and 2006-154124 filed on Jun. 2, 2006.

BACKGROUND OF THE INVENTION

1. Field of the Invention

The present invention relates to a control device that controls a drive signal to be supplied from a drive device to a load apparatus in a PWM manner.

2. Description of the Related Art

Conventionally, controlling the drive of an electric load apparatus (simply, load apparatus) has been performed in many ways. Of those, one way is to allow a control device to PWM-control a drive signal to be supplied to a load apparatus with the help of switching elements. The PWM-controlled drive signal provided from the control signal is able to control the drive of the load apparatus. In such a control device, a path connecting the load apparatus and the switching elements is electrically monitored as to whether or not a monitored signal shows changes in response to the PWM signal. If a situation where such changes have disappeared (i.e., no history) is found, it can be estimated that the path has short-circuited. As can be seen from Japanese Patent Unexamined Publication No. 09-196991, this is a typical detecting configuration for the path.

Specifically, in this kind of control device, when the load apparatus has been short-circuited to an H-level (high potential provided by a power supply, which is also referred to as a battery voltage (or battery terminal voltage) represented by "+B"), the monitored signal is forcibly fixed at the H-level irrelevantly to how the PWM signal changes. Unlike this situation, once the load apparatus has been short-circuited to an L-level (the ground level), the monitored signal is forcibly fixed at the L-level irrelevantly to changes in the PWM signal. In other words, since the short circuit suppresses the monitored signal form changing in response to those in the PWM signal, it is possible to estimate that a short circuit has occurred.

Thus depending on the monitored signal is fixed at which level, what kind of short circuit, that is, H-level short circuit or L-level short circuit, can be determined.

By the way, while the conventional system adopts a configuration in which switching elements are arranged between a control device and a load apparatus, recent systems adopt a different circuitry. Specifically, instead of the switching elements, a drive device is arranged in which one or more versatile IC chips having a plurality of switching elements and circuits for other functions are integrated. This arrangement aims at saving not only handling work for arranging plural switching elements but also costs for the arrangement in cases where the operations of a plurality of load apparatuses are controlled respectively and/or additionally having functions other than the PWM control with the switching elements.

Such a drive device may normally have a function of detecting the occurrence of short circuit from signals to be fed to or outputted from the switching elements and informing it toward the outside of the drive device. Even if so, this drive device still suffers from the drawback that it is impossible to determine and inform that the short circuit occurred at which level, or at the H-level or the L-level. Hence only information indicating the occurrence of the short circuit is still insufficient, because it does not provide any information showing that the short circuit occurs at which potential side.

This problem could be resolved if the drive device is formed to determine whether a short circuit is occurring at the H-level side or the L-level side and to notify an outside apparatus of the determined results. However, additionally providing such functions to a drive device results in that the drive device cannot be handled as a versatile device any longer, whereby costs for manufacturing the drive devices will be raised.

Therefore, it is desirable that a versatile device can be used as much as possible as the drive device. In addition, it is also desirable if such a versatile type of drive device can be used, as it is (without redesigning), to detect information about a short circuit and the information from the drive device can be processed by another device to determine that the short circuit is occurring at which potential level.

SUMMARY OF THE INVENTION

The present invention has been completed with the above view in mind and has an object to provide a short-circuit detection technique that allows a versatile type of drive device to detect the occurrence of a short circuit which may occur in an electric path connecting the drive device and an electric load apparatus and is able to determine that the short circuit is occurring at which potential (H-level or L-level), on the basis of detected information about the short circuit, which comes from the versatile type of drive device.

To achieve the above object, as a fundamental aspect of the present invention, there is provided a control device for controlling a drive signal to be supplied from a drive device to a load apparatus along an electric path connecting the drive device and the load apparatus, wherein the drive device comprising load control means for receiving a PWM (pulse width modulation) signal so that the drive signal is PWM-controlled on the PWM signal; detecting means for detecting information about a short circuit in the electric path; and notification means for notifying the information about the short circuit detected by the short circuit detecting means; the control device comprising: producing means for producing the PWM signal to be supplied to the drive device; inquiry means for inquiring of the notification means about the information about the short circuit at predetermined inquiry intervals; first determining means for determining whether or not the detecting means detects the short circuit based on the information about the short circuit notified from the notification means in response to the inquiry of the inquiry means; and second determining means for determining how the short circuit occurs, on the basis of history information in the information about the short circuit notified from the notification means when the first determining means determines that the detecting means detects the short circuit.

Hence, if a short circuit occurs in the path between the drive device and the load apparatus, the control device is able to analyze signals acquired after the occurrence of the short circuit and to determine how the short circuit is. As a result, even if the drive device do not have the capability of issuing information about how the short circuit is, it is possible for the control device to estimate how the short circuit is (i.e., information indicating what kind of short circuit is occurring; more particularly, information indicting whether the path is short-circuit to the battery terminal voltage (+B terminal voltage) or the ground).

Preferably, the first determining means is configured to determine whether or not the detecting means detects the short circuit based on the history information during each inquiry interval.

Still preferably, the control device further comprising duty ratio fixing means for fixing a duty ratio of the PWM signal at 0% or 100% in cases where the first determining means detects the short circuit, wherein the second determining means is configured to determine how the short circuit is, on the basis of the history information notified from the notification means after the duty ratio fixing means fixes the duty ratio of the PWM signal, and wherein the inquiry intervals are set to be longer than a period of time during which the PWM signal changes a level thereof at least one time from an L-level interval to an H-level or from an H-level interval to the L-level.

Hence, the inquiry for the short circuit is made at intervals longer than the H-level interval or the L-level interval of the PWM signal, each inquiry interval always includes both H-level and L-level (or parts of thereof). If a short circuit is not found in the H-level interval (or L-level interval), the short circuit can be found in the L-level interval (or H-level interval) if it really occurs. Such longer inquiry intervals are thus helpful for avoiding the reception of erroneous information indicating that no short circuit has not occurred yet, contrary to the fact that the short circuit has already continuously occurred.

It is preferred that the PWM signal is set to have a plurality of cycles or duty ratios and the inquiry intervals are set such that an inquiry interval for the next is set to be longer than a period of time during which the PWM signal being supplied next changes the level thereof at least one time from the L-level interval to the H-level or from the H-level interval to the L-level.

It is also preferred that the PWM signal is set to have a plurality of cycles or duty ratios and the inquiry intervals are set such that, in cases where a change period during the PWM signal changes the level hereof from the L-level interval to the H-level or from the H-level interval to the L-level is longer than a predetermined period, a period of time longer than the change period is set to an inquiry interval for the next, while in cases where the change period is shorter than the predetermined period, the predetermined period is set to the inquiry interval for the next.

Preferably, in the case that the load control means is configured to PWM control the drive signal at a low potential in the path along which the drive signal is supplied to the load apparatus, the second determining means includes means for determining that, when the first determining means determines that the detecting means has not detected the short circuit yet after fixing the duty ratio of the PWM signal by the duty ratio fixing means, the path is short-circuited to a level opposite to the level of the PWM signal fixed by the duty ratio fixing means, and means for determining that, when the first determining means determines that the detecting means has detected the short circuit yet after fixing the duty ratio of the PWM signal by the duty ratio fixing means, the path is short-circuited to the level of the PWM signal fixed by the duty ratio fixing means.

In this case, the second determining means may include means for determining that, when the first determining means determines that the detecting means has not detected the short circuit yet after fixing the duty ratio of the PWM signal by the duty ratio fixing means, the path is short-circuited to the level of the PWM signal fixed by the duty ratio fixing means, and means for determining that, when the first determining means determines that the detecting means has detected the short circuit yet after fixing the duty ratio of the PWM signal by the duty ratio fixing means, the path is short-circuited to a level opposite to the level of the PWM signal fixed by the duty ratio fixing means.

It is also possible that, by way of example, the inquiry intervals are set to be shorter than either one, which is shorter than the other, of an L-level interval or an H-level interval of the PWM signal, and the second determining means is configured to determine how the short circuit occurs in the path, based on whether the PWM signal to the drive device represents the H-level or the L-level at a time when the first determining means determines that the detecting means detects the short circuit.

Such shorter inquiry intervals make it possible to receive history information about short circuits acquired before and after the PWM signal changes its levels (from the L-level (H-level) to the H-level (L-level)). This means that the occurrence of a short circuit can be checked more finely on both L-level and H-level and the kind of the short circuit can also be determined more quickly without fail.

DETAILED DESCRIPTION OF PREFERRED EMBODIMENTS

Various embodiments of an on-vehicle battery system according to the present invention will now be described with reference to the accompanying drawings.

First Embodiment

Referring to FIGS. 1A-1B to 7A-7D, a first embodiment of a load driving system according to the present invention will now be described.

Figure 1A:
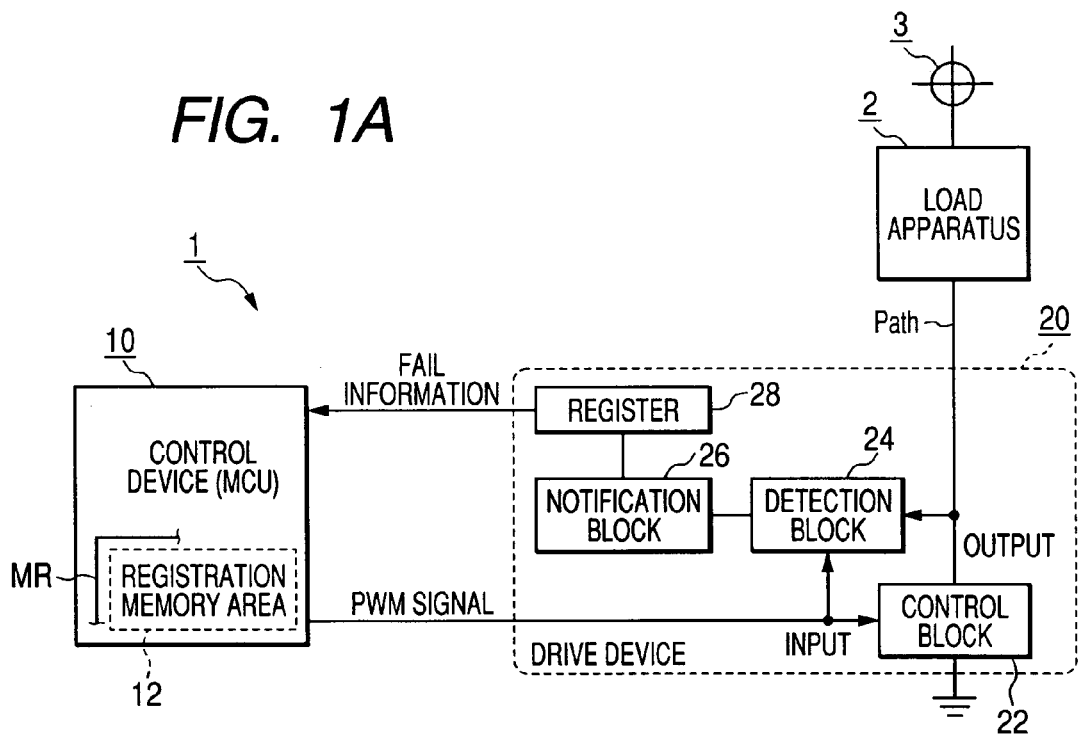
FIG. 1A is a block diagram showing a load driving system according to a first embodiment of the present invention.

As shown in FIG. 1A, a load driving system in the first embodiment is provided with a control device (MCU) 10 and a drive device (or chip) 20, in which the control device (or chip) 10 orders the drive device 20 to control the operations of a load apparatus 2. In the present embodiment, the load apparatus 2 is composed of an electric inductive load, such as electric motor or solenoid).

The control device 10 incorporates an internal memory MR in which data of one or more programs for controlling the operations of the load apparatus 2 is installed. Based on this program, a PWM signal having a predetermined duty ratio (also called a duty cycle or, simply, duty) is produced at intervals so that the produced PWM signal is fed to the drive device 20 and later-described processing is performed to estimate how an electric path $P_{ath}$ connected from the drive device 20 to the load apparatus 2 has been short circuited if such a thing has happened. The electric path $P_{ath}$ includes a conductive wire and terminals to which the wire is coupled. In the following description, assume that the control device 10 operates on positive logic.

The drive device 20 is composed of an IC chip in which various types of circuits are integrated. Such circuits include a control block 22, detection block 24, notification block 26, and register 28. The control block 22 applies PWM control processing to a drive signal to be supplied to the load apparatus 2 on the basis of the PWM signal given from the control device 10. The detection block 24 detects a short circuit happening in the path from the drive device 20 to the load apparatus 2. The notification block 26 issues information notifying that the detection block 24 has detected a short circuit (or simply short). The register 28 is arranged so as to be accessed from the control device 10.

Of these blocks, the control block 22 is composed of switching elements that are able to bring the low-potential side of a path, along which a drive signal is supplied from the power supply 3 to the load apparatus 2, into either an electrically conducted state or an electrically non-conducted state (called open state) in response to the PWM signal coming from the control device 10. That is, the control block 22 serves as a low-side type of drive circuit which PWM-controls the drive signal to be supplied to the load apparatus 2. Thus the low-side type means that the control block 22 operates on the potential (polarity) of an L (low)-level.

The detection block 24 includes a comparator which makes a comparison as to their signal levels between the PWM signal from the control device 10 and the drive signal PWM-controlled in the control block 22. The comparator is configured to output a resultant signal indicating results by compared by the comparator to the notification block 26. To be specific, in cases where the comparison shows that the relationship between both the signals is the same as that obtained when the drive signal is PWM-controlled normally, the comparator outputs a signal indicating that the compared result is normal, that is, no short circuit occurs in the path to the load apparatus 2. However, in the opposite case, that is, the comparison shows that the relationship between both the signals is different from that obtained when the drive signal is PWM-controlled normally, the comparator outputs a further signal indicating that a short circuit has occurred in the path to the load apparatus 2.

The notification block 26 operates depending on the output signal from the detection block 24. In other words, when such an output signal indicates a normal operation (i.e., no short circuit), the notification block 26 writes into the resister 28 safe information meaning the normal. In contrast, when the output signal indicates an occurrence of a short circuit, the notification unit 26 withes into the resister 28 fail information indicating such occurrence of the short circuit. Responsively to writing either the safe information or the fail information into the resister 28, the notification block 26 allows the resister 28 to notify a member (i.e., control device 10), having access to the resister 28, information in relation to the history of occurrence of a short circuit (s).

As a practical application, the drive device 20 is provided by, for example, "model MC33882 produced by Motorola, Inc." This model MC33882 is provided with a transistor serving as the control block 22, two comparators serving as the detection block 24, and an OR circuit serving as the notification block 26.

Figure 2:
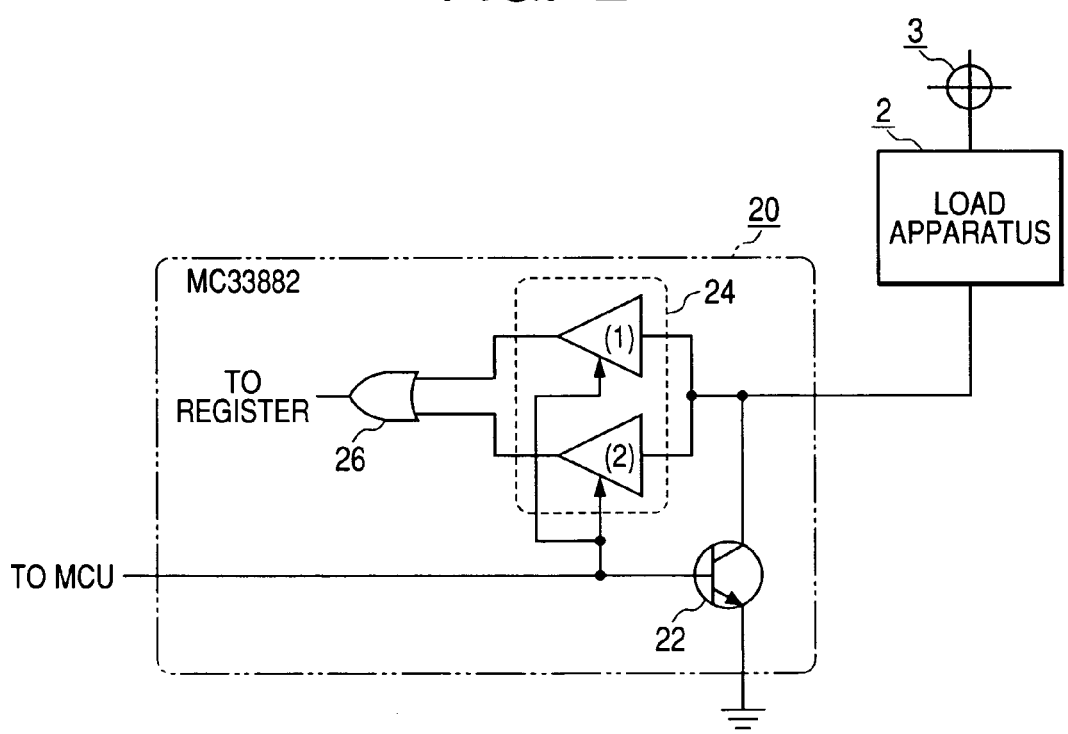
FIG. 2 is a circuit diagram showing the configuration of a drive device.

In this model MC33882 shown in FIG. 2, of the two comparators composing the detection block 24, one comparator (1) outputs to the OR circuit an H-level signal in response to a state, while the PWM signal (input signal) from the control device 10 is in the H-level, the drive signal (output signal) have a level equal to or higher than a predetermined value. Meanwhile the other comparator (2) outputs to the OR circuit an H-level signal in response to a state, while the PWM signal (input signal) from the control device 10 is in the L-level, the drive signal (output signal) have a level less than the predetermined value.

The notification block 26 is configured to write the safe information into the register 28 by issuing a signal indicating that the output signal is normal, in a state where the output signals from both comparators of the detection block 24 are in the L-level. However, in a case where at least one of the output signals from the comparators is in the H-level, the notification block 26 writes the fail information into the register 28 by issuing a signal indicating a short circuit has occurred in the path to have the output signal shot-circuited.

Figure 1B:
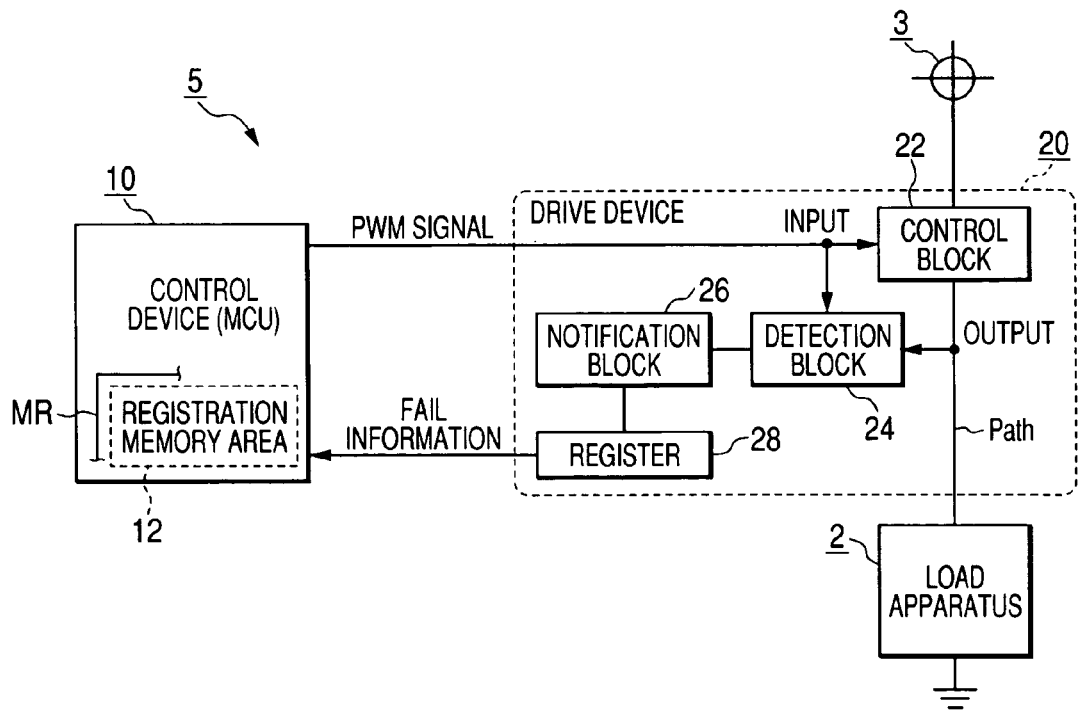
FIG. 1B is a block diagram showing a load driving system according to a modification of the first embodiment.

A modification of the load driving system 5 will now be described. As shown in FIG. 1B, the load driving system 5 has a configuration different only in part from that shown in FIG. 1A.

To be specific, the difference lies in the control block 22 in the drive device 20. In this modification, the control block 22 is composed of switching elements that are able to bring the high-potential side of the path $P_{ath}$, along which the drive signal is supplied from the power supply 3 to the load apparatus 2, into either an electrically conducted state or an electrically non-conducted state (called open state) in response to the PWM signal coming from the control device 10. That is, the control block 22 serves as a high-side type of drive circuit which PWM-controls the drive signal to be supplied to the load apparatus 2. Thus the high-side type means that the control block 22 operates on the potential (polarity) of an H (high)-level.

(Operation for Determining the Short Circuit)

Referring to FIGS. 3, 4 and 7A-7D, processing for determining a short circuit which may occur in the path from the drive device 20 to the load apparatus 2 will now be described. This processing will be called "short circuit determining processing" and carried out by the control device 10, and the path is called a "path being detected."

The short circuit determining processing is carried out during the drive of the load apparatus 2 by inputting to the drive device 20 a PWM signal having a duty ratio (or duty, duty cycle) necessary for enabling the control device 10 to drive the load apparatus 2.

When this short circuit determining processing is activated, the processing is made to wait for a predetermine timing at which the path being detected is checked (No at step S102). In the present embodiment, the control device 10 has the internal memory MR in which information about a period of time longer than the cycle of the PWM signal to be inputted to the drive device 20. The period of time, at which the following processing should be repeated periodically, is set to a temporal value which is equal to a sum of the cycle of the PWM signal plus a constant time (for example 10 ms). In the present embodiment, the waiting is carried out during this period of time.

When the timing for checking a short circuit has come (YES at step S102; refer to timing t2 in FIG. 7A), a fault detected state is then checked (step S104). The "fault detected state," which is handled as a variable stored in the internal memory of the control device 10, is formed to transfer from a state in which a value 0 (initial value) is stored to a state in which any of values 0-4 is stored.

When the fault detected state is determined as "0" at step S104, the information written in the register 28 of the drive device 20 is read out and it is determined whether or not the read-out information includes the fail information (that is, whether or not the drive device 20 has found out a short circuit which may occur in the path being detected) (step S112). In this processing, after reading the information from the register 28, the information is cleared (deleted) from the register 28. In this way, whenever the register 28 is accessed, the information which has been stored in the register 28 is cleared. This clearance allows the register 28 to memorize information about the history of occurrence of a short circuit (detected history) detected during a period of time from the last access to the next access.

In cases where the determination that no fail information is included is made, that is, the drive device 20 has not detected a short circuit (No at step S112), the processing returns to step S102.

On the other hand, if it is determined that the fail information is included, this means that the drive device 20 has detected a short circuit (Yes, at step S112). This situation is exemplified at a timing t1 in FIG. 7A, where information notifying the occurrence of an abnormal event such as a short circuit is written in the resister 28. In this case, the fault detected state is set to "1" (refer to (1) of FIG. 5) (step S114). Then, in order to fix the level of the PWM signal at the L-level, the duty ratio of the PWM signal to be supplied to the drive device 20 is fixedly set to 0% (step S116), before the processing is made to return to step S102. At step S116, setting 0% to the duty ratio of the PWM signal leads to fixing the level of the PWM signal at its L-level.

By the way, in cases where the control device 10 operates on the negative logic, the processing at step S116 allows the duty ratio of the PWM signal to be fixed at 100%. This means that the level of the PWM signal is also fixed at is L-level.

In cases where the fault detected state is found to be "1" at step S104, the processing identical to that at step S112 is carried out. In other words, it is checked whether or not the drive device 20 has detected a short circuit which may occur in the path being detected (step S122). This situation is exemplified at a timing t3 in FIG. 7A. In the same way as described before, the information stored in the register 28 is read out and then cleared at this step.

When the determination at step S122 shows that the drive device 20 has detected a short circuit (Yes at step S122), the determination is then carried out about whether the control block 22 of the drive device 20 is a low-side type of drive circuit or a high-side type of drive circuit (step S124).

In the present embodiment, the internal memory of the control device 10 contains a registration memory area 12, in which various types of pieces of information is stored which includes information as to whether the control block 22 is either a low-side type or a high-side type. Such pieces of information are previously stored in the registration memory area 12 in manufacturing the drive device 20. To be specific, in the present invention (FIG. 1A), the information showing the high-side type of drive circuit is previously registered. In contrast, in the alternative configuration (FIG. 1B), the information showing the low-side type of drive circuit is previously registered. Thus, at step S124, using the information registered in the registration memory area 12, it is checked whether or not the control block 22 is either the low-side type or the high-side type.

Figure 5:
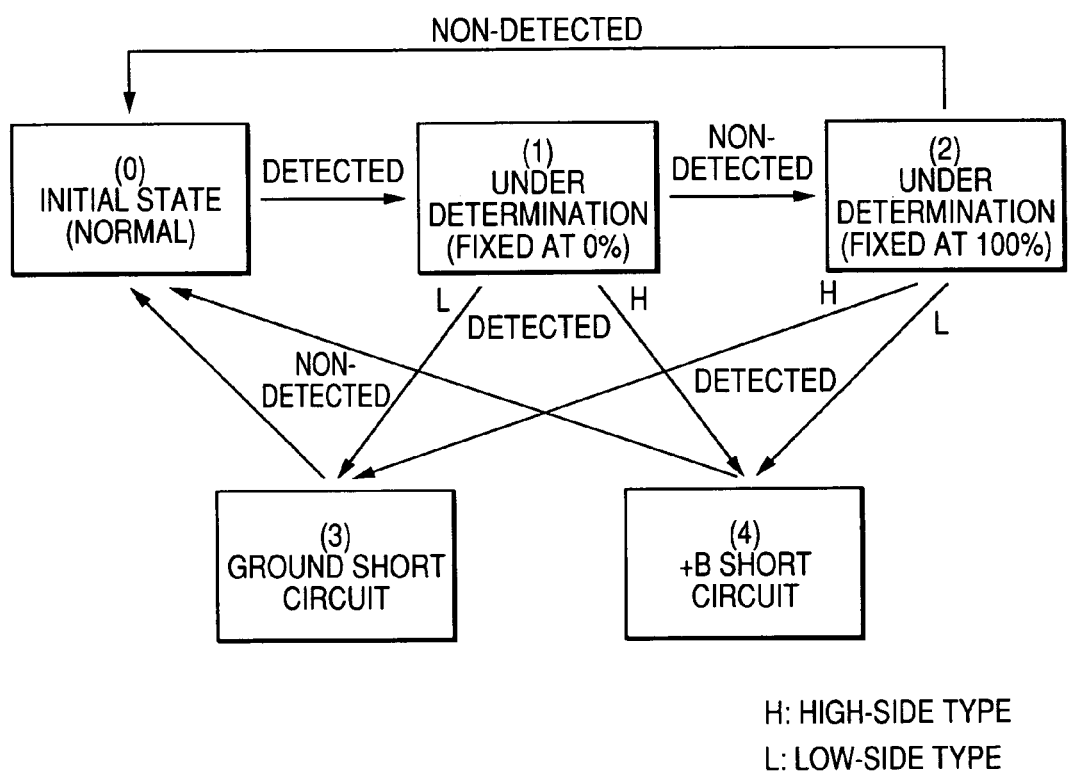
FIG. 5 is an illustration explaining the transitions of a fault detected state.

When it is determined at step S124 that the control block 22 is formed as a high-side type of drive circuit (No at step S124), the fault detected state is set to "4," before going back to step S102 (refer to (4) in FIG. 5; step S126).

On the other hand, it is determined at step S124 that the control block 22 is formed as a low-side type of drive circuit (Yes at step S124), the fault detected state is set to "3," before going back to step S102 (refer to (3) in FIG. 5; step S128).

In cases where it is determined at step S122 that the drive device 20 has not detected a short circuit (No at step S122), the fault detected state is set to "2" (refer to (2) in FIG. 5; step S130). Then, to fix the level of the PWM signal at the H-level, the duty ratio of the PWM signal to be supplied to the drive device 20 is fixed at 100% (step S132), before this processing returns to step S102. Such a setting action for the duty ratio allows the level of the PWM signal to be fixed at the H-level. In contrast, as shown in FIG. 1B, the control device 10 operates on the negative logic, the processing at step S132 is such that the duty ratio of the PWM signal to the drive device 20 is fixed at 0%, so that the PWM signal is able to fixedly have the H-level signal.

Further, when it is found out at step S104 that the fault detected state is "2," it is also checked whether or not the drive device 20 has detected a short circuit occurring in the path being detected (step S142 in FIG. 4), like the processing in step S112. At this step, clearing the information stored in the register 28 is also carried out after reading out the information therefrom.

When it is determined at step S142 that the drive device 20 has detected a short circuit (Yes at step S142), the determination whether or not the control block 22 of the drive device 20 is a low-side type or a high-side type of drive circuit is then carried out (step S144) in the same way that in the step S124.

In the case that the determination at step S144 shows that the control block 22 is a high-side type (No at step S144), the fault detected state is set to "3" (refer to (3) in FIG. 5; step S146), before returning to step S102.

By contrast, when the determination at step S144 shows that the control block 22 is a low-side type (Yes at step S144), the fault detected state is set to "4" (refer to (4) in FIG. 5; step S148), before returning to step S102.

On the other hand, the determination at step S142 reveals that no short circuit has been detected by the drive device 20 (No at step S142), the fault detected state is se to "0" (refer to (0) in FIG. 5; step S150). The duty ratio of the PWM signal to the drive device 20 is made to return to a value necessary for driving the load apparatus 2 (step S152), before the processing returns to step S102.

The foregoing processing at step S104 provides the fault detected state of "3," the identical processing to that at step S112 is carried out, that is, it is determined whether the drive device 20 has found out a short circuit in the path being detected (step S162). In this step, in the same was as the foregoing, reading out the information form the register 28 is followed by deleting the information therefrom.

When the determination at step S162 is made such that the drive device 20 has detected a short circuit (Yes at step S162), the control device 10 estimates that the path being detected has short-circuited to the L-level side (step S164).

More detailed explanations will now be given. In the configuration shown in FIG. 1A, that is, the control block 22 of the drive circuit 20 is a low-side type of drive circuit, a short circuit of the path being detected to the L-level side (for example, the ground) forcibly causes this path to be fixed in the signal level at the L-level, regardless of changes in the PWM signal. Hence even if the level of the PWM signal to the drive device 20 is in its L-level, the level of the drive signal along the path is blocked out from being H-level.

In addition, to transfer to the processing at step S162, it is required that "3" be set to the fault detected state at step S128. However, setting "3" to the fault detected state requires that the fault detected state be set to "1" at step S114 and the duty ratio of the PWM signal be fixed at 0% at step S116 (i.e., the L-level), before being transferred to steps S122 to S128. Hence in the control block 22 consisting of the low-side type of drive circuit, a transfer of the processing to step S162 teaches that the level (L) of the PWM signal and the level (L) of the drive signal is the same.

In the configuration shown in FIG. 1B, that is, the control block 22 of the drive circuit 20 is a high-side type of drive circuit, a short circuit of the path being detected to the L-level side (for example, the ground) forcibly causes this path to be fixed in the signal level at the L-level, regardless of changes in the PWM signal. Hence even if the level of the PWM signal to the drive device 20 is in its H-level, the level of the drive signal along the path is blocked out from being H-level.

In addition, to transfer to the processing at step S162, it is required that "3" be set to the fault detected state at step S128. However, setting "3" to the fault detected state requires that the fault detected state be set to "2" at step S130 and the duty ratio of the PWM signal be fixed at 100% at step S132 (i.e., the H-level), before being transferred to steps S142 to S126. Hence in the control block 22 consisting of the high-side type of drive circuit, a transfer of the processing to step S162 teaches that the level (H) of the PWM signal and the level (L) of the drive signal is different from each other.

Hence, in the period of waiting time during which the processing proceeds from step S102 to step S162, the levels of the PWM and drive signals have a predetermined relationship different from that obtained when the drive signal is PWM-controlled in the normal condition. That is, when the control block 22 is formed as a low-side type, the predetermined relationship is that the PWM and drive signals are both L-levels, while the control block 22 is formed as a high-side type, the predetermined relationship is that the PWM and drive signals are at mutually different levels. In the drive device 20, the detection block 24 is able to detect a short circuit based on the predetermined relationship, so that fail information is registered in the register 28. Accordingly, at step S164, the control block 22 is able to determine that the path being detected is short-circuited to the L-level at the time of processing at step S162, because the fail information is included in the information read out from the register 28.

Based on the information relating to the determined short circuit at step S164, processing for protecting the load apparatus 2 is ordered by the control block 22 (step S166), and the processing returns to step S102. For example, the protection processing is to inform a user of which level side to which the short circuit has occurred, so that the user can take a restoring operation to the normal condition.

It is sufficient that the protection processing carried out at step S166 is bale to protect the load apparatus 2. For instance, such processing is to stop the supply of the drive signal to the load apparatus 2. In such a case, after the processing to stop the supply of the drive signal is carried out at step S166, the drive signal may be re-supplied in response to a user's operation which can be expected after the stop, and then the processing is returned to step S102.

In addition, when it is determined at step S162 that the drive device 20 has not detected any short circuit (No at step S162), the fault detected state is set to "0" (refer to (0) in FIG. 5; step S168). And the duty ratio of the PWM signal supplied to the drive device 20 is retuned to the value necessary for driving the load apparatus 2 (step S170), before being returned to step S102.

If it is found at step S104 that the fault detected state is "4," the processing is carried out in the same way as that at step S112. That is, whether or not the drive device 20 has detected a short circuit in the path being detected is checked (step S182). Like the foregoing, at this step, the information in the register 28 is also read out, before being deleted.

When the determination at step S182 is made such that the drive device 20 has detected a short circuit (Yes at step S182), the control device 10 estimates that the path being detected has short-circuited to the H-level side (step S184).

More detailed explanations will now be given. In the configuration shown in FIG. 1A, that is, the control block 22 of the drive circuit 20 is a low-side type of drive circuit, a short circuit of the path being detected to the H-level side (for example, the voltage from the power supply 3) forcibly causes this path to be fixed in the signal level at the H-level, regardless of changes in the PWM signal. Hence even if the level of the PWM signal to the drive device 20 is in its H-level, the level of the drive signal along the path is blocked out from being L-level.

In addition, to transfer to the processing at step S182, it is required that "4" be set to the fault detected state at step S148. However, setting "4" to the fault detected state requires that the fault detected state be set to "2" at step S130 and the duty ratio of the PWM signal be fixed at 100% at step S132 (i.e., the H-level), before being transferred to steps S142 to S148. Hence in the control block 22 consisting of the low-side type of drive circuit, a transfer of the processing to step S182 teaches that the level (H) of the PWM signal and the level (H) of the drive signal is the same.

In the configuration shown in FIG. 1B, that is, the control block 22 of the drive circuit 20 is a high-side type of drive circuit, a short circuit of the path being detected to the H-level side forcibly causes this path to be fixed in the signal level at the H-level, regardless of changes in the PWM signal. Hence even if the level of the PWM signal to the drive device 20 is in its L-level, the level of the drive signal along the path is blocked out from being L-level.

In addition, to transfer to the processing at step S162, it is required that "4" be set to the fault detected state at step S126. However, setting "4" to the fault detected state requires that the fault detected state be set to "1" at step S114 and the duty ratio of the PWM signal be fixed at 0% at step S116 (i.e., the L-level), before being transferred to steps S122 to S126. Hence in the control block 22 consisting of the high-side type of drive circuit, a transfer of the processing to step S182 teaches that the level (L) of the PWM signal and the level (H) of the drive signal is different from each other.

Hence, in the period of waiting time during which the processing proceeds from step S102 to step S162, the levels of the PWM and drive signals have a predetermined relationship different from that obtained when the drive signal is PWM-controlled in the normal condition. That is, when the control block 22 is formed as a low-side type, the predetermined relationship is that the PWM and drive signals are both L-levels, while the control block 22 is formed as a high-side type, the predetermined relationship is that the PWM and drive signals are at mutually different levels. In the drive device 20, the detection block 24 is able to detect a short circuit based on the predetermined relationship, so that fail information is registered in the register 28. Accordingly, at step S182, the control block 22 is able to determine that the path being detected is short-circuited to the H-level at the time of processing at step S162, because the fail information is included in the information read out from the register 28.

Like step S166, based on the information relating to the determined short circuit at step S184, processing for protecting the load apparatus 2 is ordered by the control block 22 (step S186), and the processing returns to step S102.

In addition, when it is determined at step S182 that the drive device 20 has not detected any short circuit (No at step S182), the fault detected state is set to "0" (refer to (0) in FIG. 5; step S188). And the duty ratio of the PWM signal supplied to the drive device 20 is retuned to the value necessary for driving the load apparatus 2 (step S190), before being returned to step S102.

Referring to FIGS. 7A to 7D, the foregoing short circuit determining processing carried out by the control device 10 will now be described.

Figure 7A:
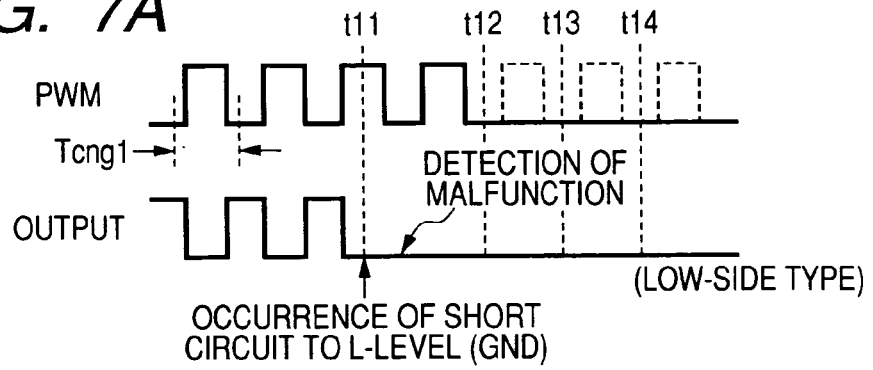
FIGS. 7A-7D are timing charts each showing changes in the levels of a PWM signal and an output signal on a path being examined, the changes being seen during the short circuit determining processing.

FIG. 7A exemplifies a short circuit to the L-level (i.e., the ground; hereinafter simply "ground short circuit") in the path connected to a low-side type of drive device, FIG. 7B exemplifies a short circuit to the H-level (i.e., the +B voltage of an on-vehicle power supply; hereinafter simply "+B short circuit") in the path connected to a low-side type of drive device, FIG. 7C exemplifies a short circuit to the L-level in the path connected to a high-side type of drive device, and FIG. 7D exemplifies a short circuit to the H-level in the path connected to a high-side type of drive device.

First of all, the case shown in FIG. 7A (the low-side type and the ground short circuit) will be detailed.

When a ground short circuit occurs in the path being detected (timing t11 in FIG. 7A), the detection unit 24 detects an abnormal state when the PWM signal and the path being detected are both at the L-level, because the drive device 20 is a low-side type. Thus fail information, which is detected by the detection unit 24, is written in the register 28.

In response to the next timing for the check (timing t12), the information is read out from the register 28 at step S104, and fail detection is carried out at step S112. At this step S112, it is determined in the drive device 20 that a short circuit has occurred, so that the fail detected state is set to "1" at step S114 and the duty ratio is fixed at 0% at step S116.

In this case, if there is no occurrence of the short circuit (i.e., in the normal state), the output signal through the path being detected should be fixed at the H-level. However, the short circuit which occurred is a short to the L-level, resulting in that the detection unit 24 keeps outputting a signal indicating this abnormal state (i.e., the short circuit).

In response to the next check timing (timing t13), the processing proceeds to step S122 by responding to the default detected state of "1." In the register 28 from which the information was already deleted at the check carried out last time (t12), results produced by the comparison between the PWM signal and the output signal are written, which have been acquired during the period of time between the timings t12 and t13. Hence, the processing at step S122 shows "Yes," before returning to step S124.

Then the determination at step S124 shows that the short circuit is the low-side type and the processing proceeds to step S128, where the default detected state is transferred to "3."

Figure 4:
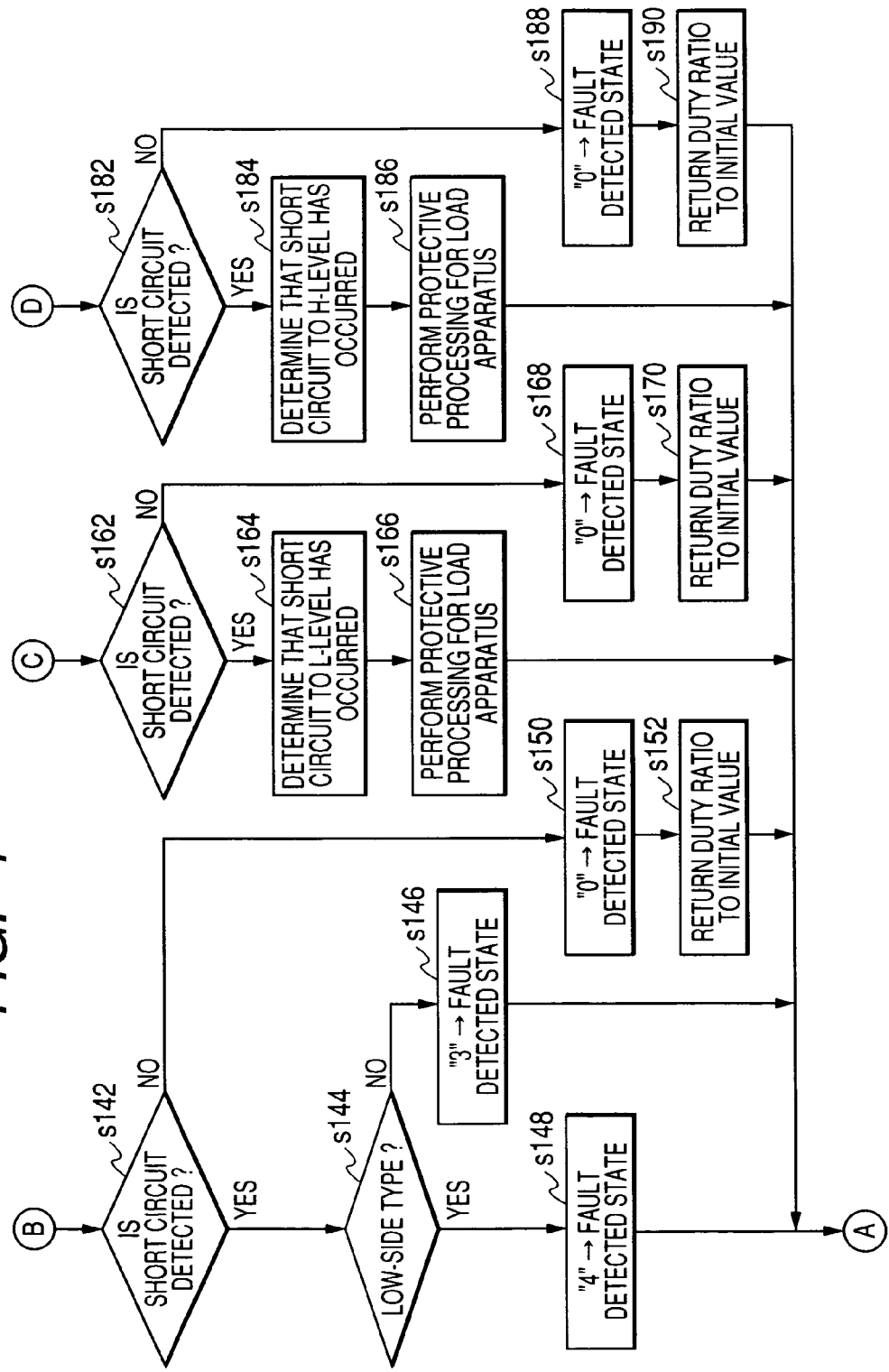

At the next check timing (timing t14), the determination at step S104 allows the processing to step S162 (refer to FIG. 4). Since it is found at step S162 that information showing results compared between the PWM and output signals, which are acquired until this timing (t14), is set, the processing proceeds to step S164, where the short circuit to the L-level can be estimated.

Figure 7B:
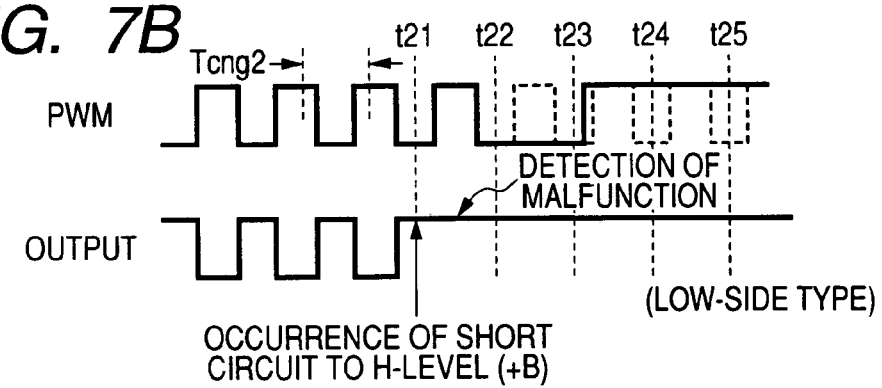

The case shown in FIG. 7B (the low-side type and the +B short circuit) will be detailed.

In response to a +B short circuit in the path being detected (timing t21 in FIG. 7B), the detection unit 24 detects an abnormal state when the PWM signal and the path being detected are both at the H-level, because the drive device 20 is a low-side type. Thus fail information, which is detected by the detection unit 24, is written in the register 28.

At the next check timing (timing t22), the information is read out from the register 28 at step S104, and fail detection is carried out at step S112. At this step S112, it is determined in the drive device 20 that a short circuit has occurred, so that the fail detected state is set to "1" at step S114 and the duty ratio is fixed at 0% at step S116.

In this case, due to the short circuit, the output signal from the path being detected is fixed at the H-level, the detection unit 24 keeps outputting a signal showing the normal state.

However, at the next check timing (timing t23), the fault detected state is set to "1," so that the processing is made to go to step S122.

In the register 28, from which the information was deleted at the time of the last check (t22), compared results between the PWM and output signals are written, in which the compared results are not changed at even this timing (t23). Hence at step S122, the determination of "NO" is made, and at step S130, the fault detected state is transferred to "2." At step S132, the duty ratio is fixed at 100%.

In this situation, if the system is in the normal operation with no short circuit, the output signal from the path being detected should be fixed at the L-level. However, the current short circuit is made to the H-level, the detection block 24 issues a signal showing an abnormal operation state and maintains the signal for the issuance.

At the next check timing (timing t24), the fault detected state is "2," which makes the processing go to step S142 (refer to FIG. 4).

The occurrence of this short circuit is detected at step S142, and the determination of "YES" is made at step S144. Then the fault detected state is transferred to "4" at step S148.

At the next check timing (t25), the fault detected state, which is examined at step S104, provides a value 4, with the result that the processing skips to step S182. Hence at stepS184, the fixed state at the H-level is determined.

Figure 7C:
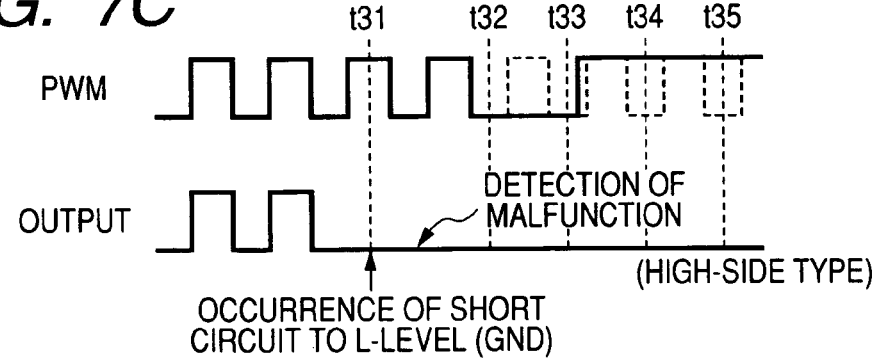
Figure 7D:
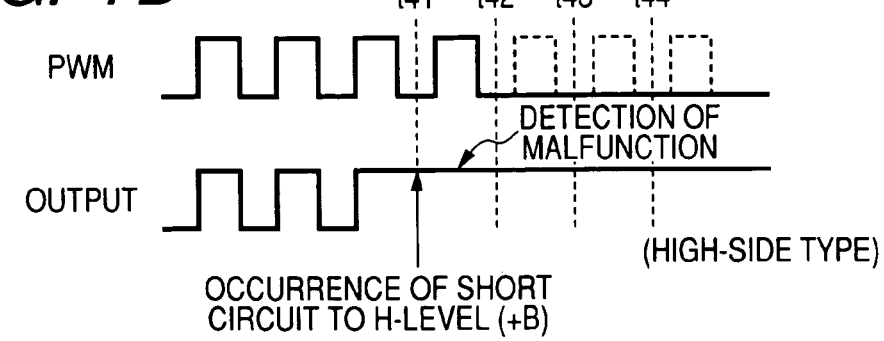

The case shown in FIG. 7C (the high-side type and the ground short circuit) will be detailed.

In response to a ground short circuit in the path being detected (timing t31 in FIG. 7C), the detection unit 24 detects an abnormal state when the PWM signal and the path being detected are both at the L-level, because the drive device 20 is a high-side type. Thus fail information, which is detected by the detection unit 24, is written in the register 28.

At the next check timing (timing t32), the information is read out from the register 28 at step S104, and fail detection is carried out at step S112. At this step S112, it is determined in the drive device 20 that a short circuit has occurred, so that the fail detected state is set to "1" at step S114 and the duty ratio is fixed at 0% at step S116.

In this case, due to the short circuit, the output signal from the path being detected is fixed at the L-level, the detection unit 24 keeps outputting a signal showing the normal state.

However, at the next check timing (timing t33), the fault detected state is set to "1," which makes the processing go to step S122.

In the register 28, from which the information was deleted at the time of the last check (t32), no compared results between the PWM and output signals are written at even this timing (t33). Hence at step S122, the determination of "NO" is made, and at step S130, the fault detected state is transferred to "2." At step S132, the duty ratio is fixed at 100%.

In this situation, if the system is in the normal operation with no short circuit, the output signal from the path being detected should be fixed at the H-level. However, the current short circuit is made to the L-level, the detection block 24 issues a signal showing an abnormal operation state and keeps the issuance.

At the next check timing (timing t34), the processing goes to step S144 through steps S104 and S142. At step S144, the determination of "NO" is made, and the fault detected state is set to "3."

At the next check timing (t35), the processing is carried out through steps of S104, S162 and S164, through which it is determined that the short circuit to the L-level has happened.

The case shown in FIG. 7D (the high-side type and the +B short circuit) will be detailed below.

In response to a +B short circuit in the path being detected (timing t41 in FIG. 7D), the detection unit 24 detects an abnormal state when the PWM signal and the path being detected are both at the H-level, because the drive device 20 is a high-side type. Thus fail information, which is detected by the detection unit 24, is written in the register 28.

At the next check timing (timing t42), the information is read out from the register 28 at step S104, and fail detection is carried out at step S112. At this step S112, it is determined in the drive device 20 that a short circuit has occurred, so that the fail detected state is set to "1" at step S114 and the duty ratio is fixed at 0% at step S116.

In this case, if the system is in the normal, the output signal from the path being detected should be fixed at the L-level. However, since the short circuit to the H-level has occurred, the detection unit 24 keeps outputting a signal showing an abnormal state.

However, at the next check timing (timing t43), the fault detected state is set to "1," which makes the processing go to step S122.

In the register 28, from which the information was deleted at the time of the last check (t32), compared results between the PWM and output signals are written at this timing (t43). Hence at step S122, the determination of "YES" is made, and the processing goes to step S124.

At step S124, the determination becomes "NO," because of the high-side type. Hence the processing proceeds to step S126, where the fault detected state is transferred to "4."

At the next check timing (timing t44), the determination at step S104 makes the processing go to step S182 (refer to FIG. 4).

Since results compared between the PWM and output signals, which have been done until this timing (t44), are written in the register 28, the determination at step S182 makes the processing proceed to step S184, where it is estimated that the short circuit to the H-level has occurred.

(Operations and Advantages)

In the control device 10 according to the present embodiment, in cases where a short circuit occurs in the path connecting the load apparatus 2 and the drive device 20, the contents of the short circuit can be estimated by using pieces of history information in relation to the short circuit which are stored in the register 28 immediately before or after fixing the duty ratio of the PWM signal to the drive device 20 (that is, by using pieces of information in relation to transitions in the contents notified from the drive device 20).

In the control device 10 according to the present embodiment, the period of time which must be periodically waited at step S102, that is, an access interval to the resister 28 in the drive device 20, is set longer than the cycle of the PWM signal to be supplied to the drive device 20.

The access interval (one interval) decided in this way always includes the L- and H-level intervals of the PWM signal. Thus, even when the drive device 20 does not detect a short circuit even in the H-level (or L-level) interval of the PWM signal, the drive device 20 is able to have a chance to detect a short circuit the L-level (or H-level) interval thereof instead. Accordingly, using this access interval when having access to the register 28, an erroneous situation can be avoided steadily in which an actually-occurring short circuit on the side of the drive device 20 cannot be detected by the detection block 24, resulting in that erroneous information showing non-occurrence of a short circuit is read out from the resistor 28.

In addition, the foregoing drive device 20 is configured to detect a short circuit on the basis of the levels of both the PWM and drive signals. Hence, in a situation where the potential of the path to the load apparatus 2 is fixed at a certain level (L- or H-level), the detecting operations of the detection block 24 cannot be effected unless the level of the PWM signal is different from the relationship between the levels of the PMW and drive signals at the time of the occurrence, wherein the relationship is obtained when the drive signal is normally PMW-controlled.

Figure 6A:
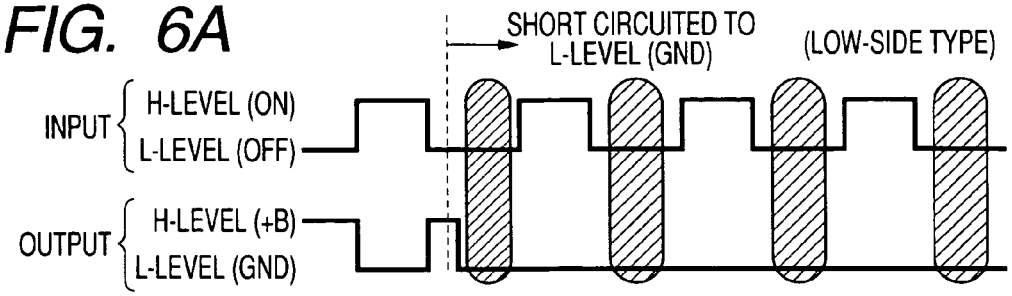
FIGS. 6A-6D are timing charts exemplifying waveforms of a PWM signal (input signal) and an output signal on a path being detected.
Figure 6B:
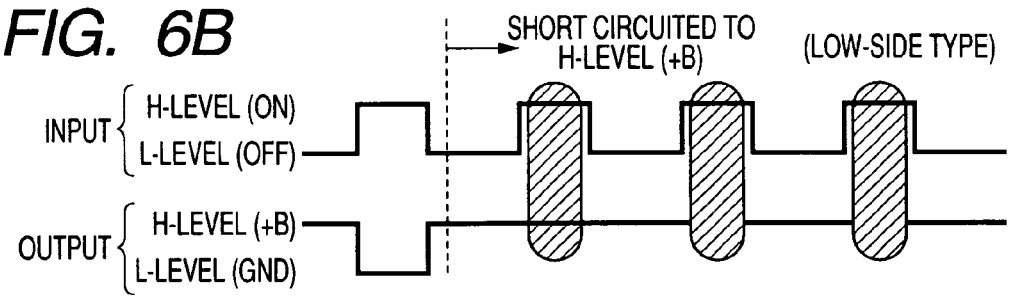

Practically, assume that the control block 22 is formed as a low-side type of drive circuit. In this case, even when the potential of the path being detected (i.e., "output" to the load apparatus 2) is fixed at the L-level due to a short circuit occurring therein, the occurrence of the short circuit cannot be detected, unless the PWM signal ("input" to the drive device 20) shows the same L-level at the time of the occurrence (refer to shaded areas in FIG. 6A). In addition, the potential of the path being detected is fixed at the H-level due to a short circuit occurring therein, the occurrence of the short circuit cannot be detected, unless the PWM signal shows the same H-level at the time of the occurrence (refer to shaded areas in FIG. 6B).

Figure 6C:
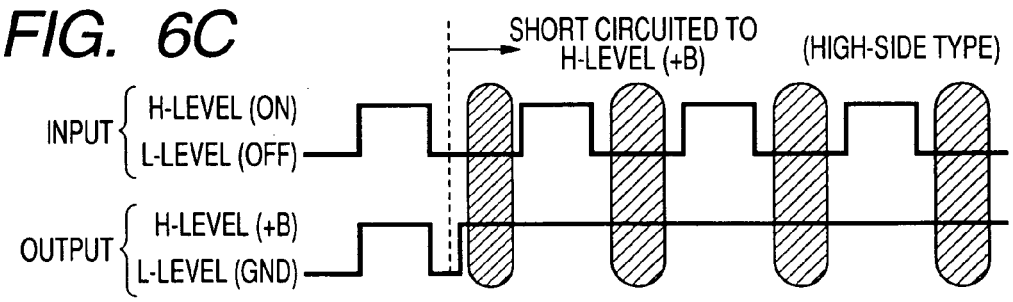
Figure 6D:
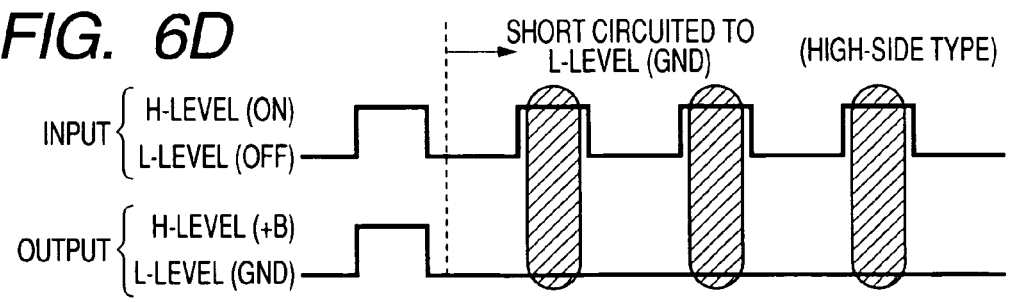

Similarly, assume that the control block 22 is formed as a high-side type of drive circuit. In this case, even when the potential of the path being detected ("output") is fixed at the H-level due to a short circuit occurring therein, the occurrence of the short circuit cannot be detected, unless the PWM signal ("input") shows the L-level at the time of the occurrence (refer to shaded areas in FIG. 6C). In addition, the potential of the path being detected is fixed at the L-level due to a short circuit occurring therein, the occurrence of the short circuit cannot be detected, unless the PWM signal shows the H-level at the time of the occurrence (refer to shaded areas in FIG. 6D).

Therefore, during a period from the occurrence of a short circuit to a timing at which the short circuit is detected, having access to the register 28 results in an erroneous notification. That is, though a short circuit occurs actually, information which does not include fail information is sent back to the control device 10. This is not so good for the control device 10 which should reliably detect a short circuit and determine the type of short circuit which has happened. Sometimes an erroneous detection or determination may happen.

This means that, like the present embodiment, it is required that the access interval to the resister 28 in the drive device 20 should be longer than the H-level interval (or L-level interval) of the PWM signal.

In contrast, in the control device 10 of the present embodiment, as for a short circuit occurring in the path being detected, the duty ratio of the PWM signal to the driven unit 20 is fixed (steps S116 and S132 in FIG. 3), during which the drive device 20 tries to detect a short circuit. When the drive device 20 detects the occurrence of a short circuit (YES at step S122, YES at step S162, YES at step S142, to YES at step S182), it can be determined that the path being detected is short circuited to the level (potential; L-level or H-level) of the PWM signal of which duty is fixed (steps S164 and S184) under the condition that the control block 22 is formed as a low-side type of drive circuit.

On the other hand, when the control block 22 is formed as a high-side type of drive circuit, it can be determined that the path being detected is short circuited to the level (H-level or L-level) opposite to the level (L-level or H-level) of the PWM signal of which duty is fixed (steps S164 and S184).

Furthermore, in the control device 10, the information showing that the control block 22 is formed as a low-side type or high-side type of drive circuit can be in the registration memory area 12. This makes it possible that the type of a short circuit occurring in the path being detected can be estimated. Hence changing the registered information in the memory area 12 enables the potential (H-level or L-level) of the short circuit to be determined properly, whichever the control block 22 is formed as a low-side type or a high-side type.

Second Embodiment

Figure 8:
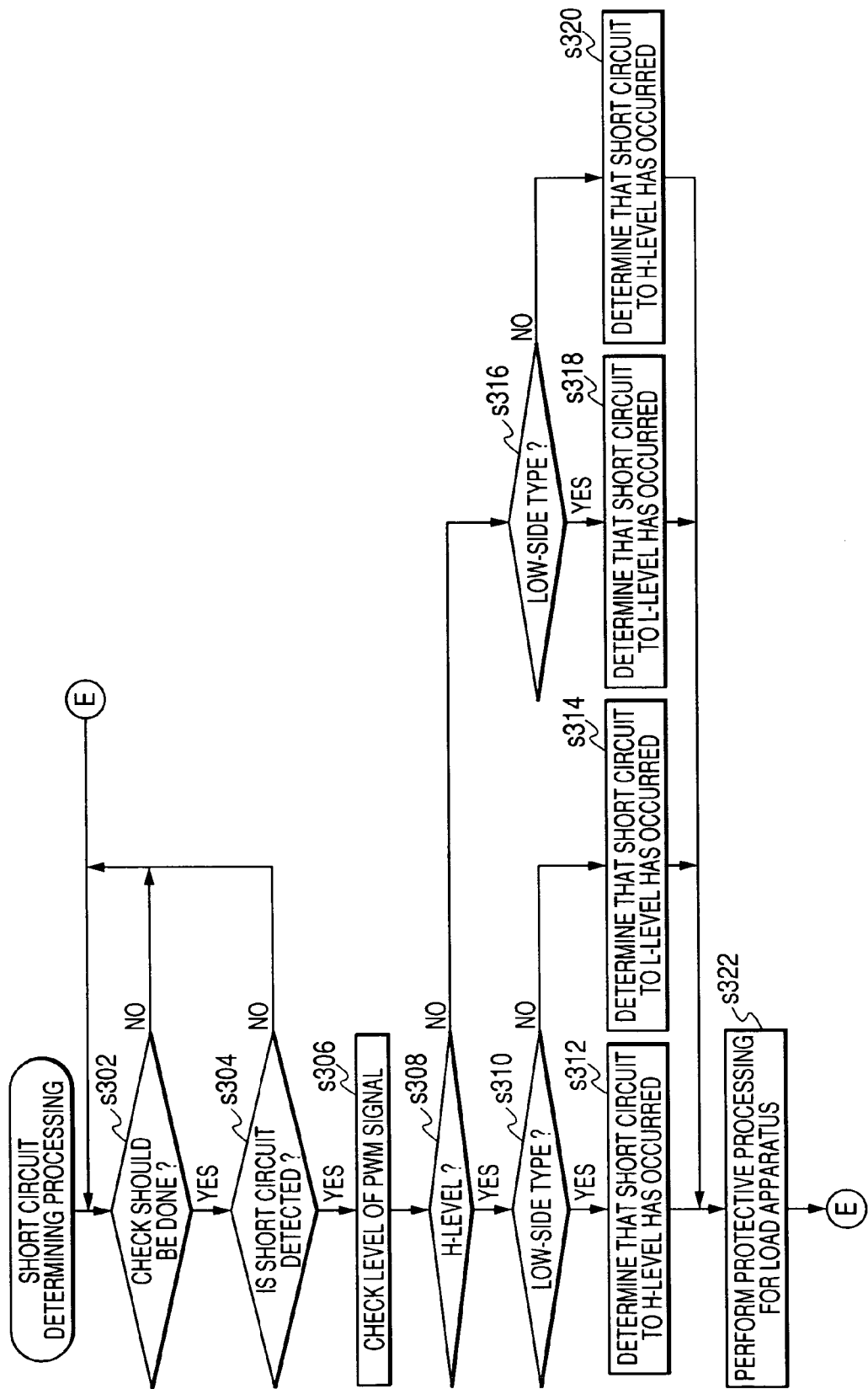
FIG. 8 is a flowchart explaining a short circuit determining processing in a second embodiment according to the present invention.

Referring to FIG. 8, a second embodiment of a load driving system according to the present invention will now be described.

The load driving system of the present embodiment is configured similarly to that in the first embodiment except for part of the procedures for the forgoing processing. The only part different from that of the first embodiment will now be focused in the following description.

Referring to FIG. 8, the short circuit determining processing will first be described.

When this short circuit determining processing is activated, the processing is ordered to wait for a timing at which the occurrence of a short circuit is checked in the path being detected (the electric path extending from the drive device 20 to the load apparatus 2) (NO at step S302). This waiting operation is carried out based on information about a periodic time on which the following processing is repeated. The control device 10 has an internal memory in which such information is stored in advance. In the present embodiment, stored as the periodic time in the internal memory is an interval which is shorter (for example by 10 ms) than either one, which is shorter than the other, of the L-level interval and the H-level interval of the PWM signal to be supplied to the drive device 20.

Figure 3:
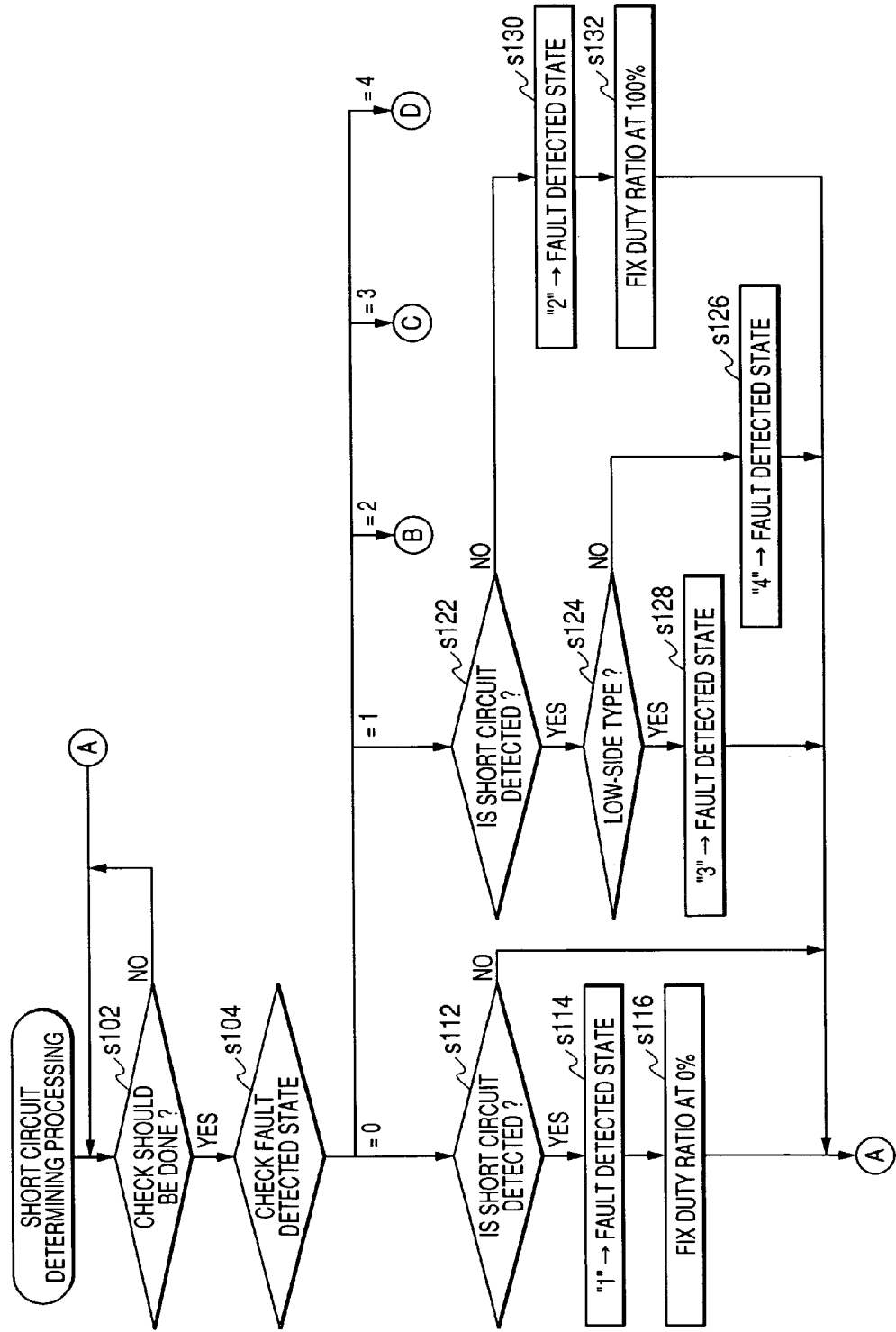
FIGS. 3 and 4 are flowcharts explaining a short circuit determining processing in the first embodiment.

At the timing for checking a short circuit (YES at step S302), the information written in the register 28 of the drive device 20 is read out in the same way as that at step S112 in FIG. 3 and it is determined whether or not the read-out information include the fail information, i.e., the drive device 20 has detected a short circuit in the path (step S304).

When the drive device 20 has not detected such a short circuit (NO at step S304), the processing is returned to step S302. But a short circuit is detected (YES at step S304), the PWM signal currently to the drive device 20 is checked as to which level thereof is currently provided (steps S306 and S308).

In the case that the check at steps S306 and S308 shows that the PWM signal currently provides the H-level (YES at step S308), it is determined whether the control block 22 in the drive device 20 is formed as a low-side type of drive circuit or a high-side type of drive circuit (step S310), similarly to the foregoing step S124.

In response to the determination of the low-side type of drive circuit (YES at step S310), a determination is made such that the path being detected has short-circuited to the H-level side (step S312). By contrast, when it is determined that the high-side type of drive circuit is adopted (NO at step S310), a determination is made such that the path detected has short-circuited to the L-level side (step S314).

In addition, it is determined that the PWM signal currently provides the L-level hereof (NO at step S308), the processing similar to the foregoing step S124 is carried out. That is, whether or the control block 22 is either a low-side type or a high-side type is checked (step S316).

When the determination is a low-side type (YES at step S316), a determination is made such that the path being detected has short-circuited to the L-level side (step S318). By contrast, when it is determined that the high-side type is adopted (NO at step S316), a determination is made such that the path detected has short-circuited to the H-level side (step S320).

In the foreign steps S304 to S320, when the control block 22 is formed as a low-side type of drive circuit and there is no occurrence of short circuits in the path being detected, the level (input level) of the PWM signal to be supplied to the drive device 20 and the level (output level) of a signal flowing through the pat being detected are always opposite to each other. Using this fact, the detection block 24 of the drive device 20 detects the occurrence of a short circuit in the path being detected. That is, when both input and output levels are not opposite to each other (i.e., both input and output levels are the same), it can be estimated that a short circuit has occurred. This means that, when a short circuit occurs, the drive device 20 cannot detect the occurrence of the short circuit and notify the history about the short circuit, as long as the input and output levels are opposite to each other at the time of the occurrence.

Practically, in a case where the input level is the H-level, the drive device 20 cannot detect a short circuit and notify the occurrence thereof, unless the path being detected has short-circuited to the H-level side. In the case that the input level is the L-level, the drive device 20 cannot detect a short circuit and notify the occurrence thereof, unless the path being detected has short-circuited to the L-level side.

Similarly to the above, when the control block 22 is formed as a high-side type of drive circuit and there is no occurrence of short circuits in the path being detected, the input level and the output level are always the same with each other. Using this fact, the detection block 24 detects the occurrence of a short circuit in the path being detected. That is, when both input and output levels are not the same with each other (i.e., both input and output levels are different from each other), it can be estimated that a short circuit has occurred. This means that, when a short circuit occurs, the drive device 20 cannot detect the occurrence of the short circuit and notify the history about the short circuit, as long as the input and output levels are the same with each other at the time of the occurrence.

Practically, in the case that the input level is the H-level, the drive device 20 cannot detect a short circuit and notify the occurrence thereof, unless the path being detected has short-circuited to the L-level side. In the case that the input level is the L-level, the drive device 20 cannot detect a short circuit and notify the occurrence thereof, unless the path being detected has short-circuited to the H-level side.

Therefore, when it is determined at step S304 that the drive device 20 has detected a short circuit, the type of the short circuit depends on the input level at the time of the determination.

For example, for the drive device 20 consisting of a low-side type of drive circuit and the input level being set to the H-level, only when the path being detected is short-circuited to the H-level side, the drive device 20 will notify that the short circuit has occurred. In the case, if the input level is set the L-level, only when the path being detected is short-circuited to the L-level side, the drive device 20 will notify that the short circuit has occurred. Similarly, for the drive device 20 consisting of a high-side type of drive circuit and the input level being set to the H-level, only when the path being detected is short-circuited to the L-level side, the drive device 20 will notify that the short circuit has occurred. In the case, if the input level is set the L-level, only when the path being detected is short-circuited to the H-level side, the drive device 20 will notify that the short circuit has occurred.

In consideration of the above facts, at the time when it can be determined that the drive device 20 has detected a short circuit (YES at step S304), the input level is set to the H-level (YES at step S308) and the low-side type of drive circuit is adopted (YES at step S310) are combinedly assigned to the determination that the path being detected is short-circuited to the H-level side (step S312).

Further, at the time when it can be determined that the drive device 20 has detected a short circuit (YES at step S304), the input level is set to the L-level (NO at step S308) and the low-side type of drive circuit is adopted (YES at step S316) are combinedly assigned to the determination that the path being detected is short-circuited to the L-level side (step S318).

Still further, at the time when it can be determined that the drive device 20 has detected a short circuit (YES at step S304), the input level is set to the H-level (YES at step S308) and the high-side type of drive circuit is adopted (NO at step S310) are combinedly assigned to the determination that the path being detected is short-circuited to the L-level side (step S314).

Lastly, at the time when it can be determined that the drive device 20 has detected a short circuit (YES at step S304), the input level is set to the L-level (NO at step S308) and the high-side type of drive circuit is adopted (NO at step S316) are combinedly assigned to the determination that the path being detected is short-circuited to the H-level side (step S320).

Hence based on the information in relation to the short circuit determined at one of steps S312 to S320, the processing for protection of the load apparatus 2 is performed (step S222) similarly to that shown by steps S166 and S186 in FIG. 4. Then the processing is returned to step S302.

(Operations and Advantages)

According to the present control device 10, there can be provided the similar advantages to the operations and advantages in the first embodiment as well as those which will be described below.

For example, in cases where a short circuit occurs in the path connecting the load apparatus 2 and the drive device 20, the short circuit can be checked as to its kind on the basis of the signal levels of the PWM signal supplied to the drive device 20 at the time of the occurrence.

In the short circuit determining processing shown in FIG. 8, an enquiry for the drive device 20 is made every interval (enquiry interval) which is shorter than either one, which is shorter than the other, of the L-level interval and the H-level interval of the PWM signal. Accordingly, each enquiry can be made before the level of the PWM signal changes two or more times (for instance, the signal level changes to either the H- or L-level and then returns to its last level).

In this case, in response to each enquiry, the drive device 20 can notify the control device 10 of information about detected history acquired respectively from the before and after conditions in which the level of the drive signal changes in accordance with the levels of the PWM signal. That is, depending on each of the levels (L- and H-levels) of the PWM signal, the occurrence of short circuits can be checked constantly, whereby the short circuits can be estimated quickly as to their kinds.

Further, for the dive unit 20 formed as a low-side type of drive circuit, at the time when it is determined that the drive device 20 has detected a short circuit (YES at step S304), detecting that the input level which is the H-level (YES at step S308) enables the determination that the path being detected has short-circuited to the H-level side (step S312). In contrast, by detecting that the input level is the L-level (NO at step S308), it can be determined that the path has short-circuited to the L-level side (step S318).

For the dive unit 20 formed as a high-side type of drive circuit, at the time when it is determined that the drive device 20 has detected a short circuit (YES at step S304), detecting that the input level which is the H-level (YES at step S308) enables the determination that the path has short-circuited to the L-level side (step S314). In contrast, by detecting that the input level is the L-level (NO at step S308), it can be determined that the path has short-circuited to the H-level side (step S320).

Third Embodiment

Figure 9:
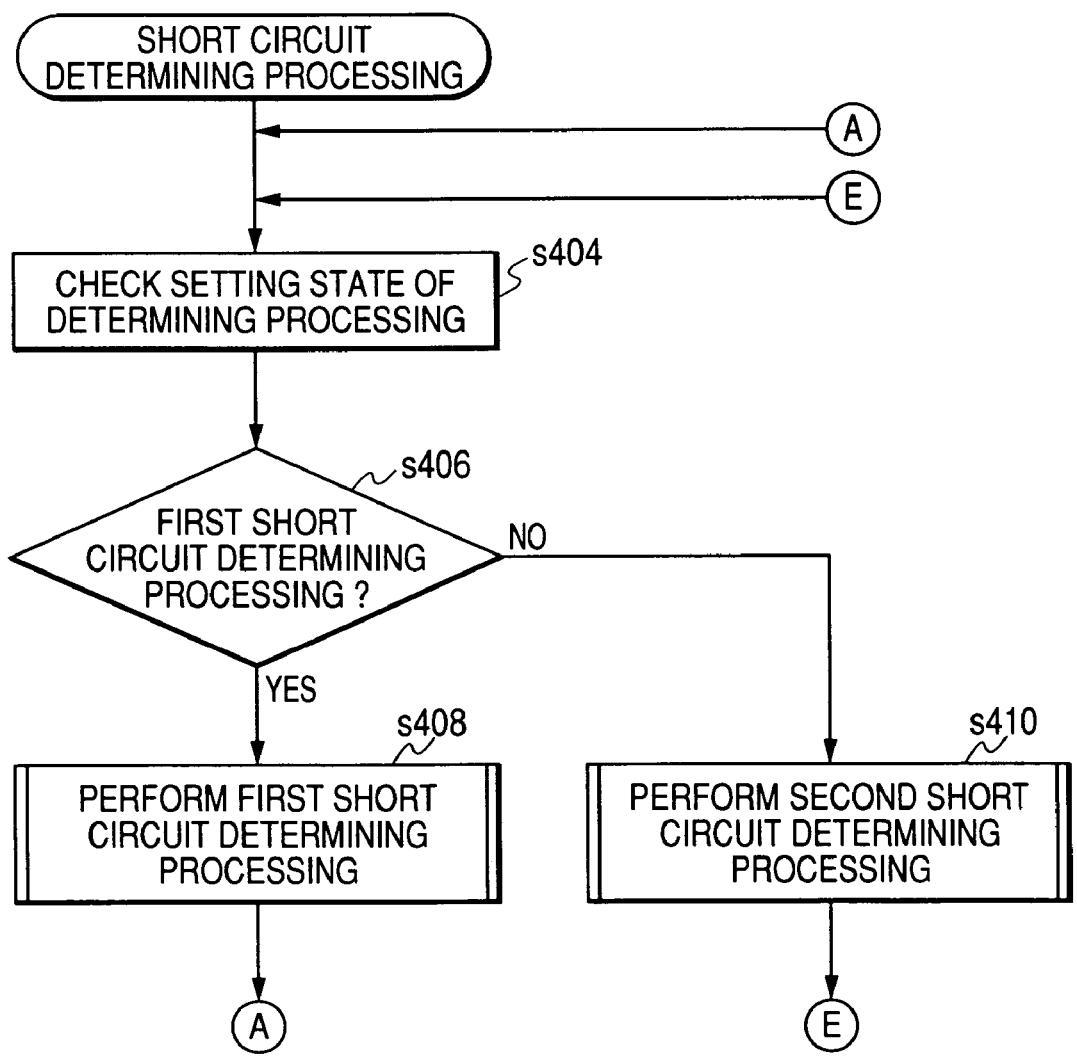
FIG. 9 is a flowchart explaining a short circuit determining processing in a third embodiment according to the present invention.
Figure 10:
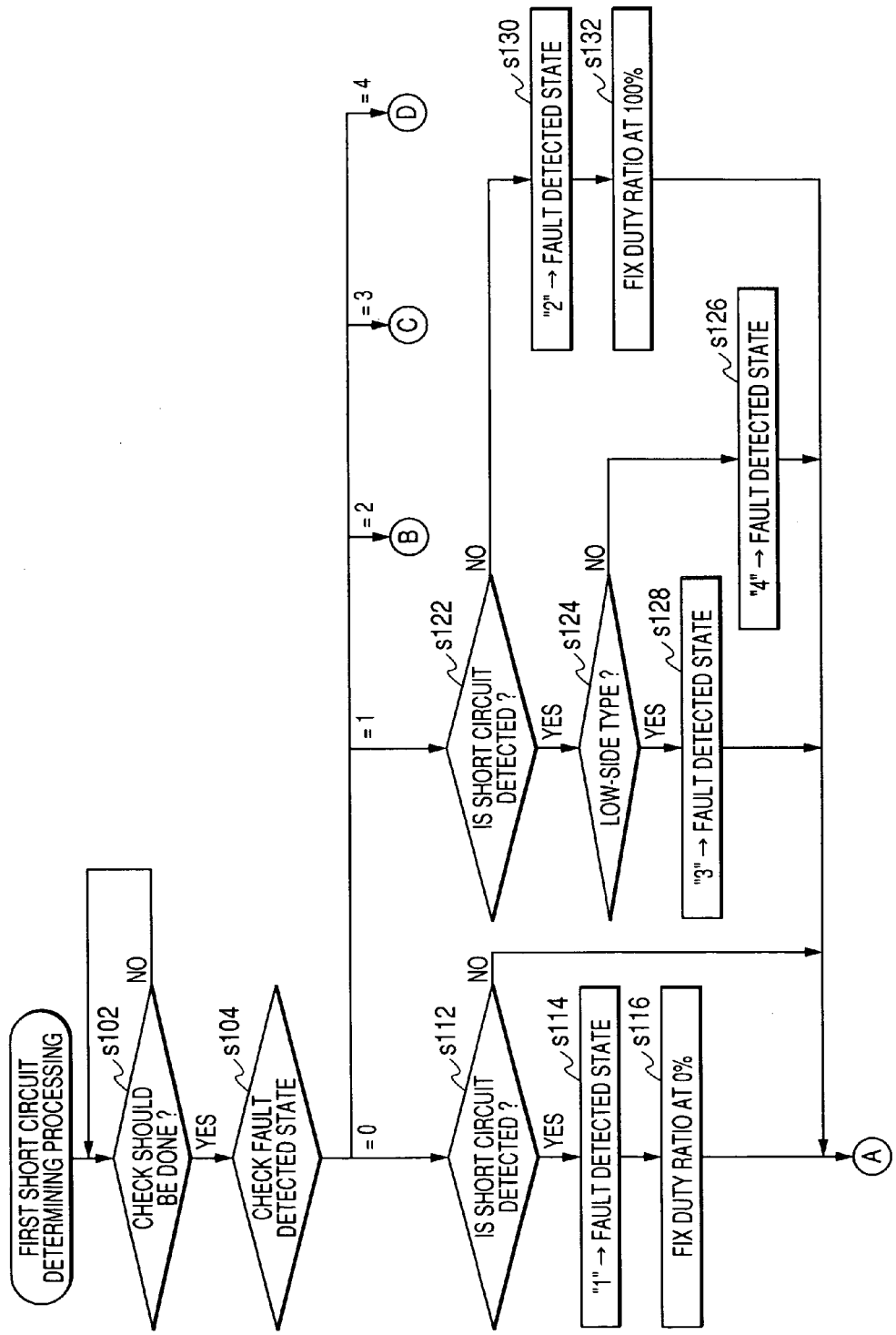
FIG. 10 is a flowchart explaining a first short circuit determining processing in the third embodiment.
Figure 11:
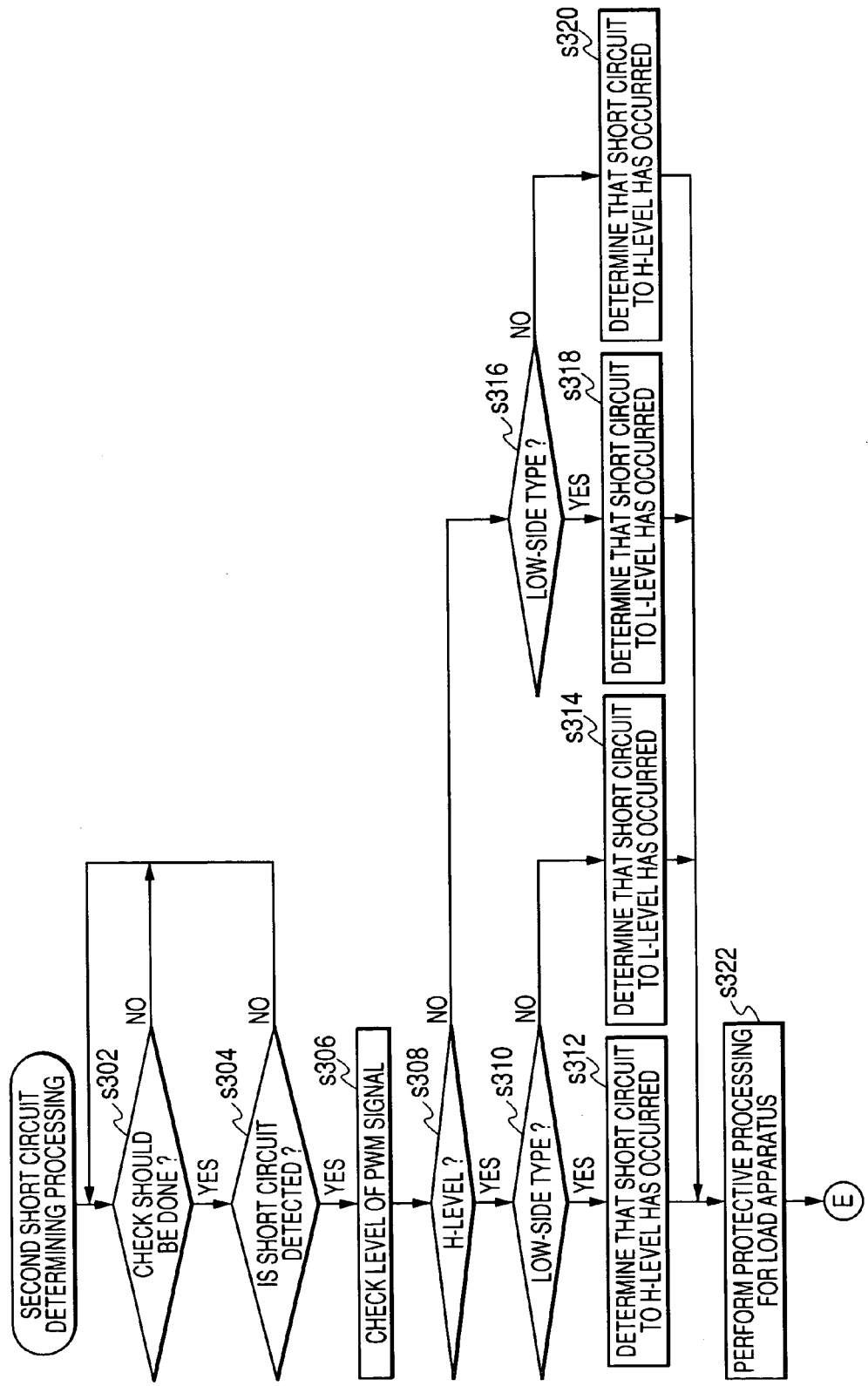
FIG. 11 is a flowchart explaining a second short circuit determining processing in the third embodiment.

Referring to FIGS. 9-11, a third embodiment of a load driving system according to the present invention will now be described.

The load driving system of the present embodiment is configured similarly to that in the first embodiment except for part of the procedures for the forgoing processing. Only part different from that of the first embodiment will now be focused in the following description.

Referring to FIG. 9, the short circuit determining processing will first be described.

When this short circuit determining processing is activated, how a determining processing has been set is checked (step S404). In the present embodiment, there are prepared a first short circuit determining processing and a second short circuit determining processing, which will be detailed later, which are processing for determining the type of a short circuit which may occur in the path extending from the load apparatus 2 to the drive device 20. In the registration memory area 12, information showing which short circuit determining processing to perform is stored in advance as the "setting state of the determining processing."

Hence based on this information in the memory are 12, the setting state of the determining processing is checked (step S404). This setting state of the determining processing is set to information showing the first short circuit determining processing as default information. However, responsively to user's input operations to the control device 10, the setting state of the determining processing can be updated. This update system may be modified such that setting state of the determining processing is updated in reply to an order coming from another apparatus data-communicable to the control device 10.

In the processing in FIG. 9, it is determined that the setting state of the determining processing is the first short circuit determining processing (YES at step S406), this processing is activated (step S408). In contrast, it is determined that the setting state of the determining processing is the second short circuit determining processing (NO at step S406), this processing is activated (step S410).

The first short circuit determining processing, which is shown in FIG. 10, is composed of steps 102 to S190 similarly to steps in FIGS. 3 and 4 (but steps S142 to S190 are omitted from the drawing) and a return process to step S402 in FIG. 9. Meanwhile the second short circuit determining processing, which is shown in FIG. 11, is composed of steps S302 to S322 similarly to steps in FIG. 8 and a return process from step S322 to step S402 in FIG. 9.

(Operations and Advantages)

According to the present control device 10, there can be provided the similar advantages to the operations and advantages in the first embodiment as well as those which will be described below.

As to whether a short circuit occurring in the path being detected is short-circuited to either the H-level or the L-level, this issue can be determined depending on either the first or second short circuit determining processing which is set at the time of the detection.

(Modifications)

Figure 12:
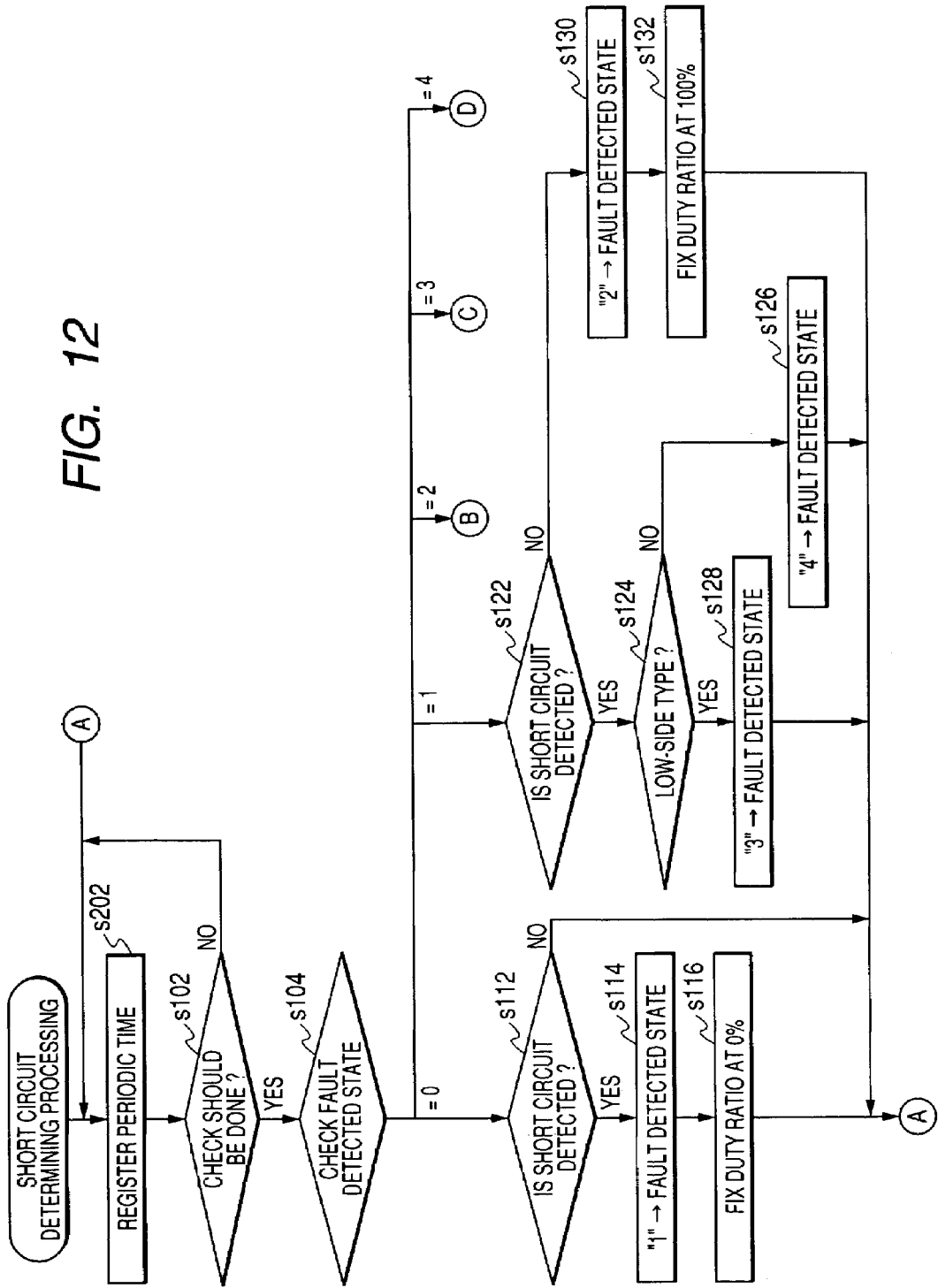
FIGS. 12-15 are flowcharts each explaining a short circuit determining processing in a modification.

Referring to FIG. 12, a first modification will now be described.

This modification relates to the waiting time which is necessary by the process at step S102 in FIG. 3 in the first embodiment. This waiting time is not always fixed at a constant period of time, but may be rewritten (updated) as needed. This rewritten processing, which comes before step S102 in FIG. 3, as follows.

As shown in FIG. 12, the processing at a step S202 is inserted before step S102. Once the short circuit determining processing is activated, the cycle or duty ratio of the PWM signal to be supplied to the drive device 20 at the next timing is checked and a certain period of time longer, by a certain amount of time (for example, 10 ms), than a period of time (i.e., a change period) required for allowing the level of the PWM signal to change from an L-level interval to the H-level or from an H-level interval to the L-level is decided and registered in the internal memory as cycle time (step S202).

The change period, which can be exemplified by Tcng1 and Tcng2 in FIGS. 7A and 7B, is decided in such a manner that, in terms of the theoretical view, when the cycle of the PWM signal is 1 ms and the duty ratio is 50%, the change period is for example 0.6 ms (=0.5 ms+0.1 ms) longer than 0.5 ms, and when the cycle of the PWM signal is 1 ms and the duty ratio is 30%, the period of time is for example 0.8 ms (=0.7 ms+0.1 ms) longer than 0.7 ms.

After completion of the registration of the cycle time, the processing proceeds to step S102 and subsequent steps. By the way, the processing which completes various routs of steps is returned to step S202.

In this way, the waiting time which must wait until the next access of the control device to the register 28 can be determined on the cycle or duty ratio of the PWM signal. And the waiting time, which always include a period of time during which changes in the level of the PWM signal (changes from the L-level interval to the H-level or the H-level interval to the L-level) is always present, can be changed as needed. Thus, even if the PWM signal are produced as a plurality of types of PWM signals having a plurality of cycles or duty ratios and such plurality of types of PWM signals are supplied to the drive device 20, the waiting time can be set depending on each PWM signal. That is, the waiting time necessarily includes a period of time containing changes in the level of each PWM signal. Using this waiting time, the interval for accessing the resister 28 can be controlled.

Figure 13:
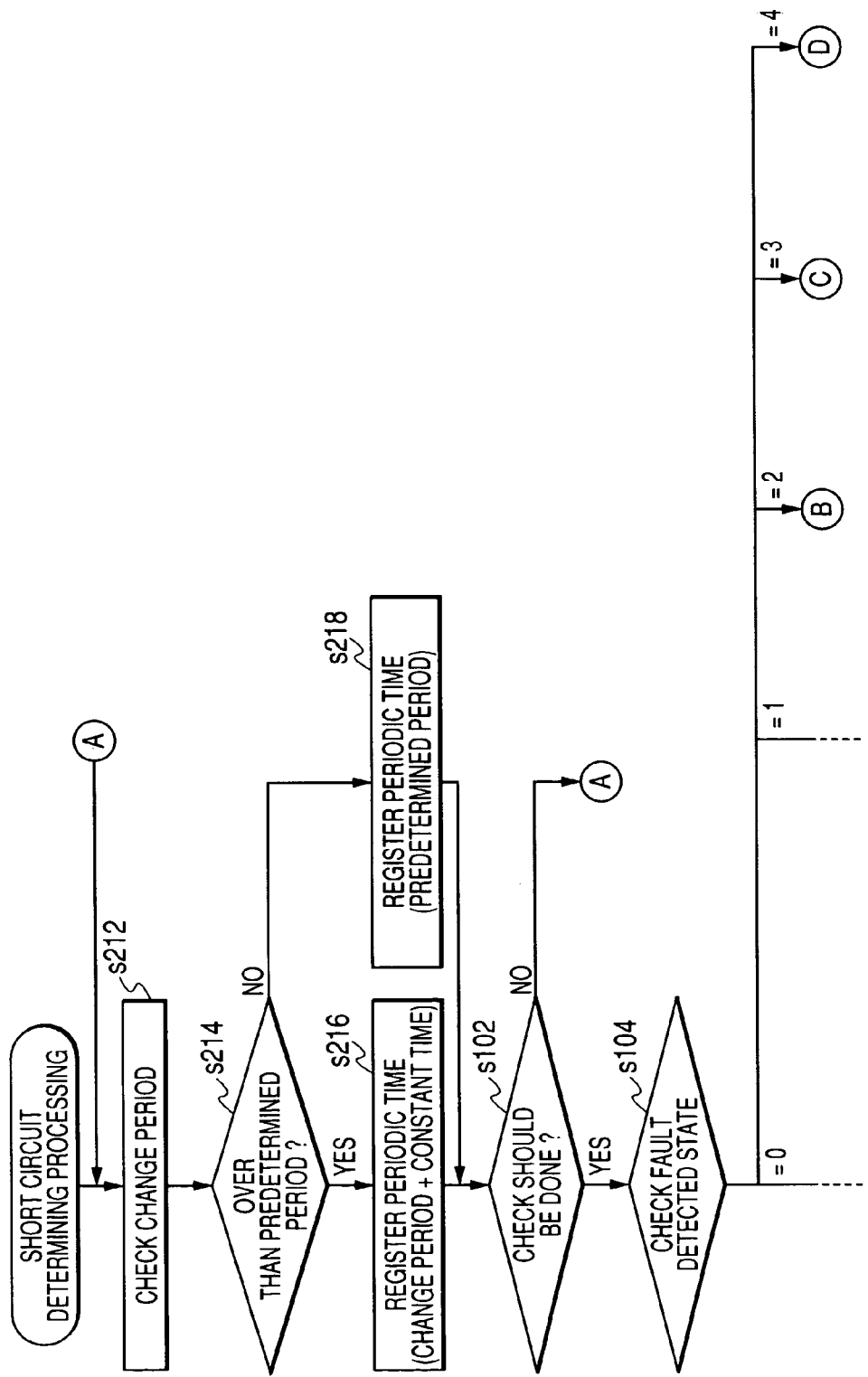

Referring to FIG. 13, a second modification will now be described.

The second modification is also concerned with the waiting time necessary by the processing at step S102 in FIG. 3 in the first embodiment.

As shown in FIG. 13, once the short circuit determining processing is activated, as to the PWM signal to be supplied to the drive device 20 at the next timing, a period of time required until the level of the PWM signal changes at least from the L-level interval to the H-level or from the H-level interval to the L-level (i.e., the change period, or the period of time necessary for the changes) is checked (step S212).

The change period checked at step S212 is then subjected to the determination whether or not this change period is over a preset period of time (predetermined period of time) (step S214). In the modification, a possible and representative period of time which is longer than the change period is set as the preset period of time for comparison with the change period.

If it is determined that the change period is within the preset period of time (NO at step S214), information showing this preset period of time is registered into the internal memory as the periodic time (step S216).

Meanwhile, it is determined that the change period is over the preset period of time (YES at step S214), a period of time longer than, at least, the change period checked at step S212 is registered in the internal memory as the periodic time (step S218). In the present modification, such a period of time is set to a sum of the change period and a constant time (for example 10 ms).

In this way, after the registration of the periodic time at either step S216 or S218, the processing proceeds to steps S102 and subsequent ones. When after completion of the various types of processing as described, the processing is returned to step S212.

Hence, when the change period of a PWM signal to be supplied to the drive device 20 at the next timing exceeds the preset period of time, a new period of time longer than this change period, which necessarily includes the change period, is newly set. Thus, even if the PWM signal are produced as a plurality of types of PWM signals having a plurality of cycles or duty ratios and such plurality of types of PWM signals are supplied to the drive device 20, the waiting time can be set depending on each PWM signal, even if the change period thereof exceeds the preset period. That is, the waiting time necessarily includes a period of time containing changes in the level of each PWM signal. Using this waiting time, the interval for accessing the resister 28 can be controlled.

Figure 14:
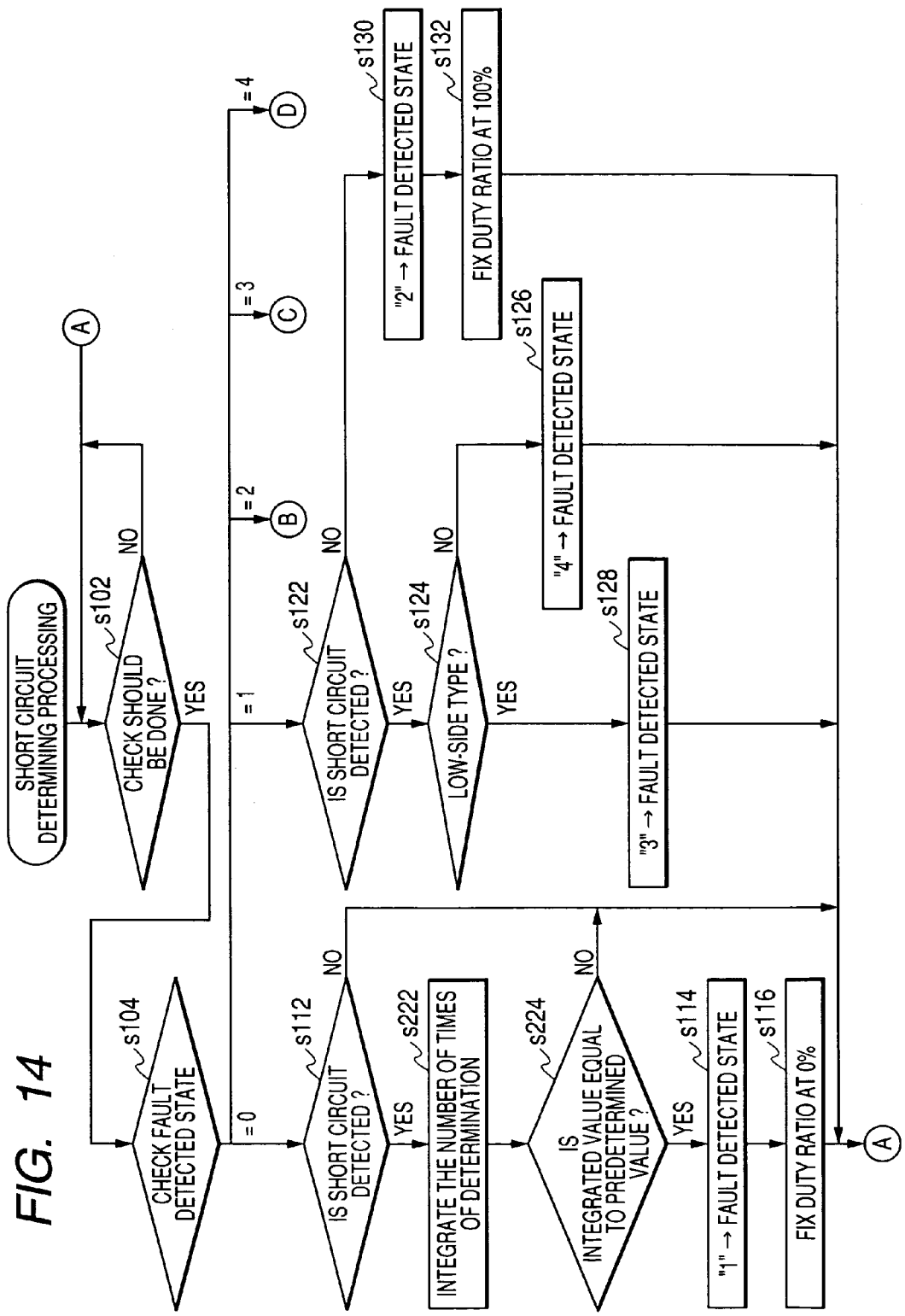

Referring to FIG. 14, a third modification will now be described.

The third modification is concerned with another way to proceed to steps S112 in FIG. 3 in the first embodiment, which is carried out only when another condition is met. Specifically, the determination "YES" at step S112 is followed by the following processing.

In the short circuit determining processing, as shown in FIG. 14, when it is determined at step S112 that the drive device 20 has detected a short circuit, the number of times of the determination that the drive device 20 detects the short circuit at step S112 (step S222). A variable for counting the number of times of such determination is previously memorized in the internal memory of the control device 10. This variable is incremented by adding "1" whenever the short circuit is detected.

When it is then checked whether or not the number of times of the determination, i.e., the value of the counting variable, becomes equal to a predetermined number of times (for example, 3 times) (step S224).

If the determination is NO at step S224, the processing is retuned to step S102 without performing the processing at steps S114 and S116. In contrast, if the determination is YES at step S224, that is, the number of times reaches the predetermined one, the processing is made to go to step S114.

In addition, by the processing at steps S152, S170, and S190 in FIG. 4, which is also applied to this modification, the duty ratio is returned to its original value and the counting variable is also reset.

Figure 15:
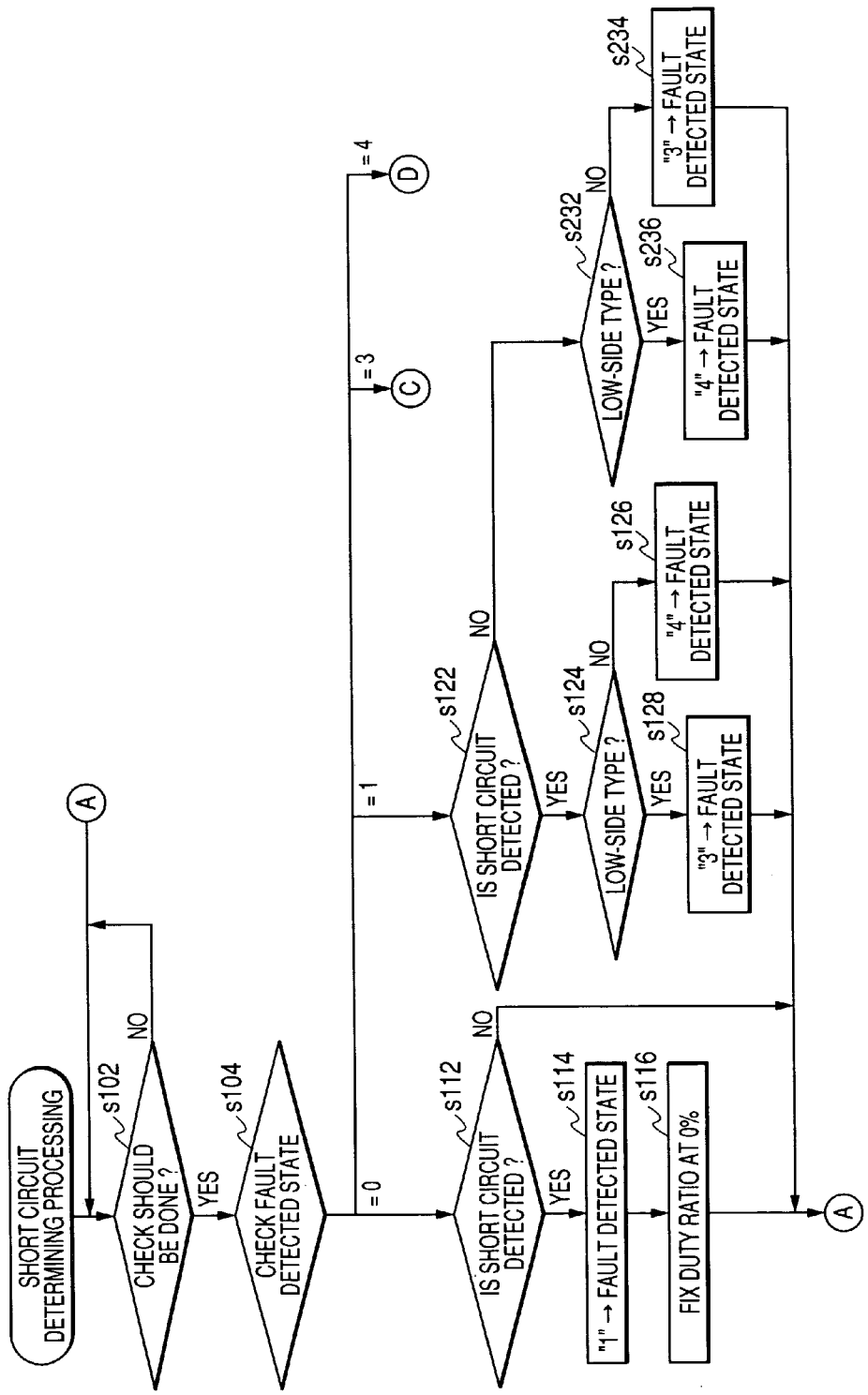

Referring to FIG. 15, a fourth modification will now be described.

The fourth modification relates to processing after it is determined that the drive device 20 has not detected a short circuit at step S112 in FIG. 3 in the first embodiment. In this respect, in the first embodiment, the fault detected state is set to "2" and the duty ratio is fixed at 100%, before returning to step S102. But the fourth modification employs another technique.

In the short circuit determining processing shown in FIG. 15, if it is determined at step S122 that the drive unit 20 has not detected any short circuit, it is then determined whether or not the control block 22 is a low-side type of drive circuit or a high-side type of drive circuit (step S232), without going to step S130.

When the determination is the high-side type of drive circuit (NO at step S232), the fault detected state is set to "3" (step S234), before the processing is returned to step S102.

However, the opposite determination is made (i.e., the low-side type of drive circuit) (YES at step S232), the fault detected state is set to "4" (step S236), before the processing is returned to step S102.

In this modification, the duty ratio of the PWM signal is fixed at 0% at step S116 in FIG. 9, but this is not a definitive list. The duty ratio may be fixed at 100%. In such a case, at step S164 in FIG. 4, it should be determined that a short circuit to the L-level occurs, and at step S184, it should be determined that a short circuit to the H-level occurs.

Figure 16:
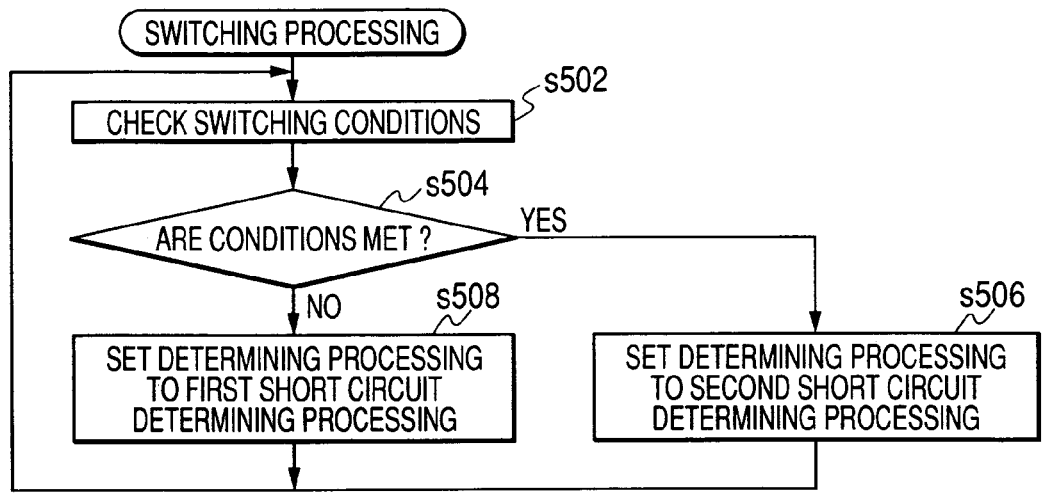
FIG. 16 is a flowchart showing switchover processing in another modification.

Referring to FIG. 16, a fifth modification will now be described.

The fifth modification relates to the setting state of the determining processing stored in the registration memory area 12 in the third embodiment. That is, this modification is the same with the third embodiment except for contents of the setting state of the determining processing.

Referring to FIG. 16, the short circuit determining processing will now be described. Switchover processing will be repeatedly performed when the control device 10 is activated.

When this switchover processing is activated, it is first checked whether or not a switchover condition is met (step S502). The switchover condition is set as a condition on which the contents of the setting state of the determining processing are switched. In this example, if the operating state of the control device 10 is in a particular state and the signal communication with the drive device 20 is performed in a particular state, the switchover condition is regarded as being met.

The checked result at step S502 is that the switchover condition is met (YES at step S504), the "setting state of the determining processing" memorized in the memory area 12 is switched to information indicating a "second short circuit determining processing" (updated to the second short circuit determining processing) (step S506). And the processing returns to step S502. If the second short circuit determining processing was already set at step S506, any processing is not carried out thereat.

By contrast, the checked result at step S502 is that the switchover condition is not met (NO at step S504), the "setting state of the determining processing" memorized in the memory area 12 is switched to information indicating a "first short circuit determining processing" (updated to the first short circuit determining processing) (step S508). And the processing returns to step S502. If the second short circuit determining processing was already set at step S508, any processing is not carried out thereat.

Other modifications are as follows.

In the first embodiment, the configuration relating to the notification block 26 that notifies an outside member of the occurrence of a short circuit may still be modified as follows. The notification block 26 is configured such that, during an interval in which the detection block 24 detects a short circuit, a signal notifying the detection is outputted to an outside member (e.g., control device 10). This makes the outside member recognize that the short circuit has been detected. To realize this configuration, the processing at steps S112, S122, S142, S162 and S182 in the short circuit determining processing should be modified so as to check if or not the notification signal continuously comes from the drive device 20.

In addition, in the above configuration that employs the notification signal, history information about contents of the notification signal may be stored in the internal memory of the control device 10. In this case, step 5104 in the short circuit determining processing is used to check the history data of the notified contents stored in the internal memory, while the history data is deleted at each of steps S112, S122, S144, S162, and S182.

In the first embodiment, the access interval defining the timing to access the register 28 in the drive device 20 may also be modified. For example, when the PWM signal is produced as a fixed signal having a duty ratio of 50% or less, the waiting time (i.e., access interval) can be set by an expression of "the cycle of the PWM signal×(1−duty ratio) <waiting time." In contrast, when the PWM signal is produced as a fixed signal having a duty ratio of more than 50%, the waiting time (i.e., access interval) can be set by an expression of "the cycle of the PWM signal×duty ratio<waiting time."

In the embodiment according to steps S102 and S302 for the short circuit detection, the waiting time may be re-set as needed. For example, after the short circuit determining processing is started up, information showing periodic time may be registered in the internal memory of the control device 10, in the same way as the short circuit determining processing (refer to FIG. 12).

To be specific, before step S302, a check is made toward the PWM signal (in terms of its cycle or duty ratio) to be supplied to the drive device 20 at the next control timing. And, a period of time shorter than either one, which is shorter than the other, of an L-level interval and an H-level interval of the PWM signal may be registered as the periodic time into the internal memory.

An alternative configuration about the periodic time is as follows. Prior to step S302, the PWM signal to be inputted to the drive device 20 at the next control timing is checked in terms of either one, which is shorter than the other, of the L-level interval and the H-level interval of the PWM signal. It is then determined whether or not the checked interval is over a preset period of time (predetermined time). In this example, an interval which can be supposed as a shorter interval of the PWM signal is previously set as the "preset period of time" for comparison with the checked interval. If the determination of being not over the preset period of time comes out, the preset amount of time (predetermined time) is registered as the periodic time into the internal memory. Meanwhile, if the determination of being over the preset period of time comes out, the checked interval (the shorter one) is registered as the periodic time into the internal memory.

Another modified example is as follows. In the short circuit determining processing in the second and third embodiments, the processing may be prevented from proceeding to step S306 in FIGS. 8 and 11, until the number of times of the determination that the drive device 20 has detected a short circuit reaches a predetermined number of times, like the foregoing one.

Figure 17:
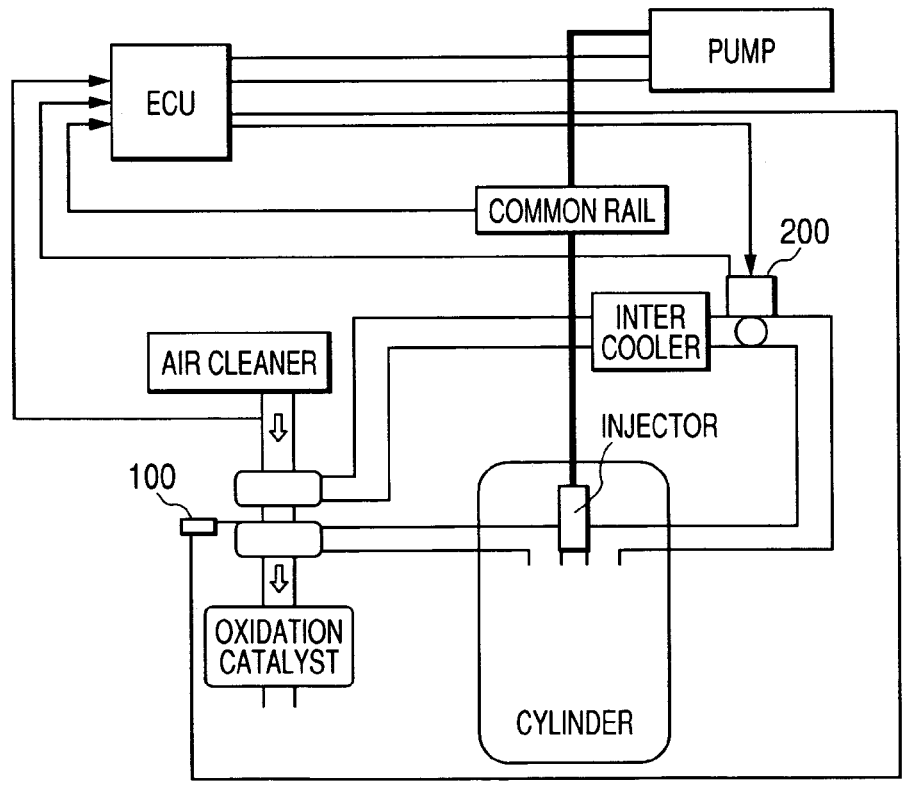
FIG. 17 is a block diagram outlining the configuration of another load driving system according to the present invention.

Practical applications of the load driving system can also be exemplified. The load driving system which has been descried so far is for driving inductive loads such as motors and solenoids. A practical example is shown in FIG. 17, in which there are a turbo motor 100 for suppressing a turbo lag in automobiles and an intake throttle valve 200 for limiting air to be in-taken in automobiles (specifically vacuum switching valve; VSV). These members 100 and 200 can be employed as the load apparatus 2.

Still further, in the embodiments, the short circuit determining processing can still modified. That is, in the embodiments, the timing for checking a short circuit in paths not being detected is determined based on only the determination whether or not the periodic time stored in the internal memory of the control device 10 has passed (refer to step S102). But, in such a determination, another determining criterion may be used in combination with the periodic time.

Figure 18:
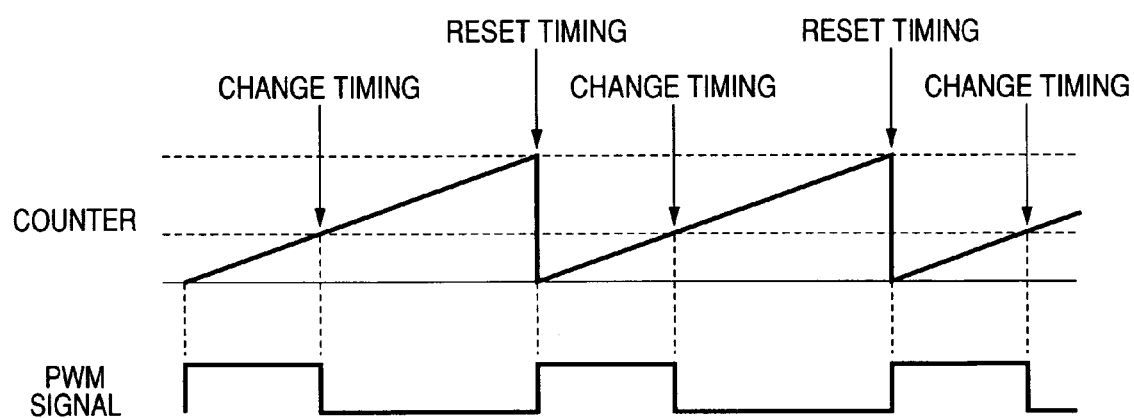
FIG. 18 is a timing chart showing a timer count in synchronization with a PWM signal.

In particular, in the second embodiment, a counter is provided in the control device 10 as shown in FIG. 18, in which the counter counts up in synchronism with the output of the PWM signal to the drive device 20 (that is, counts up the duration of the output of the PWM signal). This counter is also configured to be reset whenever one cycle of the PWM signal is completed (refer to reset timing). At each reset timing, the processing for short circuit detection can be performed as follows.

Figure 19:
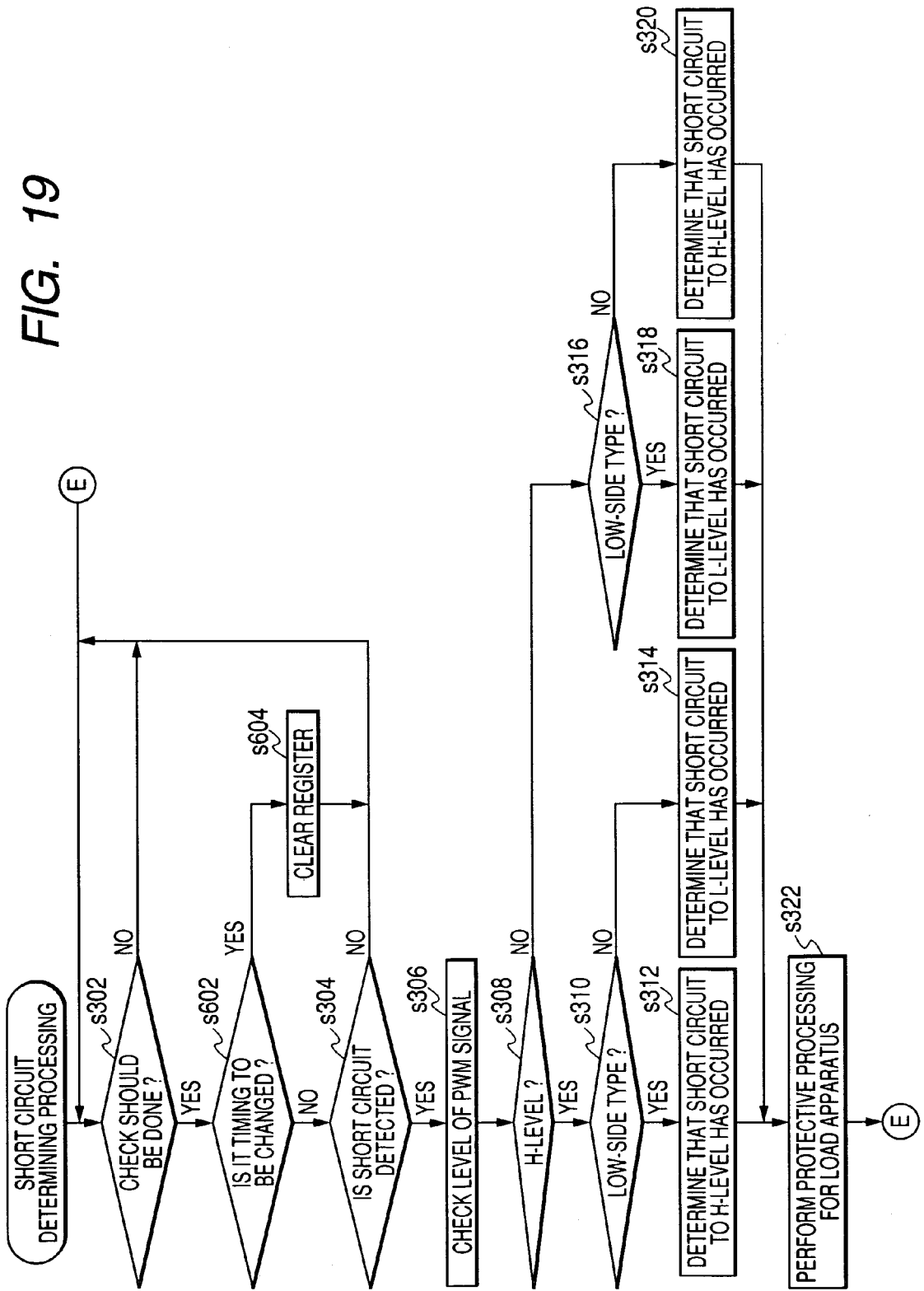
FIG. 19 is a flowchart explaining a short circuit determining processing in a modification.

In this short detecting processing shown in FIG. 19, in response to the determination of YES at step S302, it is determined whether or not it is now a particular timing to change signal levels during one cycle of the PWM signal (or whether or not it is now a further timing still advancing from the particular timing by a predetermined time (for example, 10 ms)) by using the count of the counter at this time (step S602). The "particular timing to change signal levels" is uniquely decided depending on the duty ratio of the PWM signal actually outputted to the control device 10 (refer to "change timing" in FIG. 18).

When the timing to change signal levels has yet to be reached (NO at step S602), the processing proceeds to step S304. On the other hand, it is now the timing at which signal levels should be changed (YES at step S602), the information in the register 28 of the drive device 20 will be cleared (step S604), and the processing is returned to step S302.

Therefore, immediately after the levels of the PWM signal has changed, the processing at step S304 and subsequent steps will not be carried out based on the information written in the register 28. As a result, such timings at which the signal level changes can be avoided with steadiness, under which condition the short circuit is subjected to the determination of its type.

When the level of the PWM signal is changed, the information written in the register 28 at the time of the changes is unstable. That is, it is vague whether the information comes from before the changes or after the changes. Accordingly, it is effective if the timings of the level changes can be avoided, whereby the stable information can be used to determine the type of a short circuit with precision.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. Apparatus for controlling a drive signal to be supplied from a drive device to a load apparatus along an electric path connecting the drive device and the load apparatus,
   the drive device comprising:
      load control means for receiving a PWM (pulse width modulation) signal so that the drive signal is PWM-controlled on the PWM signal;

detecting means for detecting information about a short circuit in the electric path; and notification means for notifying the information about the short circuit detected by the short circuit detecting means;

the control device comprising:

producing means for producing the PWM signal to be supplied to the drive device;

inquiry means for inquiring of the notification means about the information about the short circuit at predetermined inquiry intervals;

first determining means for determining whether or not the detecting means detects the short circuit based on the information about the short circuit notified from the notification means in response to the inquiry of the inquiry means; and second determining means for determining how the short circuit occurs, on the basis of history information in the information about the short circuit notified from the notification means when the first determining means determines that the detecting means detects the short circuit.

2. Apparatus as in claim 1, wherein:

the first determining means is configured to determine whether or not the detecting means detects the short circuit based on the history information during each inquiry interval.

3. Apparatus as in claim 2, further comprising:

duty ratio fixing means for fixing a duty ratio of the PWM signal at 0% or 100% in cases where the first determining means detects the short circuit, wherein the second determining means is configured to determine how the short circuit is, on the basis of the history information notified from the notification means after the duty ratio fixing means fixes the duty ratio of the PWM signal, and wherein the inquiry intervals are set to be longer than a period of time during which the PWM signal changes a level thereof at least one time from an L-level interval to an H-level or from an H-level interval to the L-level.

4. Apparatus as in claim 3, wherein:

the PWM signal is set to have a plurality of cycles or duty ratios and the inquiry intervals are set such that an inquiry interval for the next is set to be longer than a period of time during which the PWM signal being supplied next changes the level thereof at least one time from the L-level interval to the H-level or from the H-level interval to the L-level.

5. Apparatus as in claim 3, wherein:

the PWM signal is set to have a plurality of cycles or duty ratios and the inquiry intervals are set such that, in cases where a change period during the PWM signal changes the level hereof from the L-level interval to the H-level or from the H-level interval to the L-level is longer than a predetermined period, a period of time longer than the change period is set to an inquiry interval for the next, while in cases where the change period is shorter than the predetermined period, the predetermined period is set to the inquiry interval for the next.

6. Apparatus as in claim 3, wherein:

the load control means is configured to PWM control the drive signal at a low potential in the path along which the drive signal is supplied to the load apparatus, the second determining means including means for determining that, when the first determining means determines that the detecting means has not detected the short circuit yet after fixing the duty ratio of the PWM signal by the duty ratio fixing means, the path is short-circuited to a level opposite to the level of the PWM signal fixed by the duty ratio fixing means, and means for determining that, when the first determining means determines that the detecting means has detected the short circuit yet after fixing the duty ratio of the PWM signal by the duty ratio fixing means, the path is short-circuited to the level of the PWM signal fixed by the duty ratio fixing means.

7. Apparatus as in claim 3, wherein:

the load control means is configured to PWM control the drive signal at a high potential in the path along which the drive signal is supplied to the load apparatus, the second determining means including means for determining that, when the first determining means determines that the detecting means has not detected the short circuit yet after fixing the duty ratio of the PWM signal by the duty ratio fixing means, the path is short-circuited to the level of the PWM signal fixed by the duty ratio fixing means, and means for determining that, when the first determining means determines that the detecting means has detected the short circuit yet after fixing the duty ratio of the PWM signal by the duty ratio fixing means, the path is short-circuited to a level opposite to the level of the PWM signal fixed by the duty ratio fixing means.

8. Apparatus as in claim 3, further comprising:

control potential registering means for registering information showing that the drive signal should be PWM-controlled on which one of a low potential or a high potential in the path, the second determining means is configured to be responsive to the information registered in the control potential registering means such that, when the information registered in the control potential registering means shows the drive signal should be PWM-controlled on the low potential in the path, the second determining means including means for determining that, when the first determining means determines that the detecting means has not detected the short circuit yet after fixing the duty ratio of the PWM signal by the duty ratio fixing means, the path is short-circuited to a level opposite to the level of the PWM signal fixed by the duty ratio fixing means, and means for determining that, when the first determining means determines that the detecting means has detected the short circuit yet after fixing the duty ratio of the PWM signal by the duty ratio fixing means, the path is short-circuited to the level of the PWM signal fixed by the duty ratio fixing means; and when the information registered in the control potential registering means shows the drive signal should be PWM-controlled on the high potential in the path, the second determining means including means for determining that, when the first determining means determines that the detecting means has not detected the short circuit yet after fixing the duty ratio of the PWM signal by the duty ratio fixing means, the path is short-circuited to the level of the PWM signal fixed by the duty ratio fixing means, and means for determining that, when the first determining means determines that the detecting means has detected the short circuit yet after fixing the duty ratio of the PWM signal by the duty ratio fixing means, the path is short-circuited to a level opposite to the level of the PWM signal fixed by the duty ratio fixing means.

9. Apparatus as in claim 2, wherein:
the inquiry intervals are set to be shorter than either one, which is shorter than the other, of an L-level interval or an H-level interval of the PWM signal, and
the second determining means is configured to determine how the short circuit occurs in the path, based on whether the PWM signal to the drive device represents the H-level or the L-level at a time when the first determining means determines that the detecting means detects the short circuit.

10. Apparatus as in clam 9, wherein:
the load control means is configured to PWM control the drive signal at a low potential in the path along which the drive signal is supplied to the load apparatus, and
the second determining means is configured to determine that the path is short-circuited to the H-level whenever the PWM signal represents the H-level at a time when the first determining means determines that the detecting means detects the short circuit and determine that the path is short-circuited to the L-level whenever the PWM signal represents the L-level at the time when the first determining means determines that the detecting means detects the short circuit.

11. Apparatus as in claim 9, wherein:
the load control means is configured to PWM control the drive signal at a high potential in the path along which the drive signal is supplied to the load apparatus, and
the second determining means is configured to determine that the path is short-circuited to the L-level whenever the PWM signal represents the H-level at a time when the first determining means determines that the detecting means detects the short circuit and determine that the path is short-circuited to the H-level whenever the PWM signal represents the L-level at the time when the first determining means determines that the detecting means detects the short circuit.

12. Apparatus as in claim 9, further comprising:
control potential registering means for registering information showing that the drive signal should be PWM-controlled on which one of a low potential or a high potential in the path,
the second determining means is configured to be responsive to the information registered in the control potential registering means such that,
when the information registered in the control potential registering means shows the drive signal should be PWM-controlled on the low potential in the path, the second determining means is configured to determine that the path is short-circuited to the H-level whenever the PWM signal represents the H-level at a time when the first determining means determines that the detecting means detects the short circuit and determine that the path is short-circuited to the L-level whenever the PWM signal represents the L-level at the time when the first determining means determines that the detecting means detects the short circuit; and
when the information registered in the control potential registering means shows the drive signal should be PWM-controlled on the high potential in the path, the second determining means is configured to determine that the path is short-circuited to the L-level whenever the PWM signal represents the H-level at a time when the first determining means determines that the detecting means detects the short circuit and determine that the path is short-circuited to the H-level whenever the PWM signal represents the L-level at the time when the first determining means determines that the detecting means detects the short circuit.

13. Apparatus as in claim 3 further comprising:
processing switching means for switching to the second determining means when either a predetermined first condition is met or a predetermined second condition is met which is different from the predetermined first condition,
said first condition being based on said history information and said second condition being based on whether the PWM signal to the drive device represents the H-level or the L-level at a time when the first determining means determines that the detecting means detects the short circuit and the inquiry intervals are set to be shorter than either an L-level interval or an H-level interval of the PWM signal.

14. A short circuit detecting system in which a drive signal is supplied from a drive device to a load apparatus along an electric path connecting the drive device and the load apparatus, comprising:
the second determining means and the duty fixing means of claim 3.

15. A short circuit detecting system in which a drive signal is supplied from a drive device to a load apparatus along an electric path connecting the drive device and the load apparatus, comprising: the second determining means described in claim 9.

16. The short circuit detecting system according to claim 14, further comprising:
control potential registering means comprising control potential registering means for registering information showing that the drive signal should be PWM-controlled on which one of a low potential or a high potential in the path.

17. A load driving system in which a drive signal is supplied to a load apparatus along an electric path connecting to the load apparatus, comprising:
load control means for receiving a PWM (pulse width modulation) signal so that the drive signal is PWM-controlled on the PWM signal;
detecting means for detecting information about a short circuit in the electric path;
notification means for notifying the information about the short circuit detected by the short circuit detecting means;
producing means for producing the PWM signal;
inquiry means for inquiring of the notification means about the information about the short circuit at predetermined inquiry intervals;
first determining means for determining whether or not the detecting means detects the short circuit based on the information about the short circuit notified from the notification means in response to the inquiry of the inquiry means; and
second determining means for determining how the short circuit occurs, on the basis of history information in the information about the short circuit notified from the notification means when the first determining means determines that the detecting means detects the short circuit.

18. A program of which data is stored in memory and is readable by a computer incorporated in a control device for controlling a drive signal to be supplied from a drive device to a load apparatus along an electric path connecting the drive device and the load apparatus, the drive device comprising load control means for receiving a PWM (pulse width modulation) signal so that the drive signal is PWM-controlled on the PWM signal;
  detecting means for detecting information about a short circuit in the electric path; and
  notification means for notifying the information about the short circuit detected by the short circuit detecting means;
the program allows the computer to perform
  producing means for producing the PWM signal to be supplied to the drive device;
  inquiry means for inquiring of the notification means about the information about the short circuit at predetermined inquiry intervals;
  first determining means for determining whether or not the detecting means detects the short circuit based on the information about the short circuit notified from the notification means in response to the inquiry of the inquiry means; and
second determining means for determining how the short circuit occurs, on the basis of history information in the information about the short circuit notified from the notification means when the first determining means determines that the detecting means detects the short circuit.

* * * * *